US009996177B2

United States Patent
Iwami

(10) Patent No.: US 9,996,177 B2
(45) Date of Patent: Jun. 12, 2018

(54) CONDUCTIVE FILM, TOUCH PANEL AND DISPLAY DEVICE EMPLOYING SAME, AND EVALUATION METHOD FOR ELECTRICALLY CONDUCTIVE FILM

(71) Applicant: FUJIFILM Corporation, Tokyo (JP)

(72) Inventor: Kazuchika Iwami, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 32 days.

(21) Appl. No.: 15/053,021

(22) Filed: Feb. 25, 2016

(65) Prior Publication Data

US 2016/0170541 A1   Jun. 16, 2016

Related U.S. Application Data

(63) Continuation of application No. PCT/JP2014/072518, filed on Aug. 28, 2014.

(30) Foreign Application Priority Data

Aug. 30, 2013 (JP) .................................. 2013-180708

(51) Int. Cl.
G06F 3/041 (2006.01)
G06F 3/044 (2006.01)
H05K 9/00 (2006.01)

(52) U.S. Cl.
CPC ............ G06F 3/0412 (2013.01); G06F 3/044 (2013.01); H05K 9/009 (2013.01); H05K 9/0096 (2013.01); G06F 2203/04112 (2013.01)

(58) Field of Classification Search
CPC ......... G06F 2203/04112; G06F 3/0412; G06F 3/044; H05K 9/009; H05K 9/0096
(Continued)

(56) References Cited

U.S. PATENT DOCUMENTS 8,624,852 B2* 1/2014 Kogo .................. H03K 17/962
324/658
9,483,149 B2* 11/2016 Iwami .................... G06F 3/044
(Continued)

FOREIGN PATENT DOCUMENTS

JP   62-186498 U   11/1987
JP   06-048284 U    6/1994
(Continued)

OTHER PUBLICATIONS

Communication dated Jul. 13, 2016, issued by the European Patent Office in corresponding European Application No. 14839133.7.
(Continued)

Primary Examiner — Tony Davis
(74) Attorney, Agent, or Firm — Sughrue Mion, PLLC

(57) ABSTRACT

First and second wiring patterns which are formed on both surfaces of a base have first and second patterns which are different from each other, respectively, and are superimposed as a composite wiring pattern on a pixel array pattern. A plurality of spectrums in a two-dimensional Fourier space of transmittance image data of the pixel array pattern and the composite wiring pattern are excluded from a plurality of spectrums in a two-dimensional Fourier space of transmittance image data of a composite pattern of the pixel array pattern and the composite wiring pattern to extract a plurality of spectrums of only noise and moire generated by interference between the pixel array pattern and the composite wiring pattern. The sum of all of the extracted plurality of spectrums is calculated and an extraction quantitative value of the moire and the noise calculated from the sum is in a predetermined range.

18 Claims, 15 Drawing Sheets

(58) Field of Classification Search
USPC .................................................. 345/170–176
See application file for complete search history.

(56) References Cited

U.S. PATENT DOCUMENTS

| | | | | |
|---|---|---|---|---|
| 9,645,694 B2* | 5/2017 | Iwami | ..................... | G06F 3/041 |
| 2010/0302183 A1* | 12/2010 | Kogo | ................... | H03K 17/962 |
| | | | | 345/173 |
| 2012/0313880 A1 | 12/2012 | Geaghan et al. | | |
| 2013/0063371 A1 | 3/2013 | Lee et al. | | |
| 2015/0015979 A1* | 1/2015 | Iwami | ................. | H05K 9/0096 |
| | | | | 359/893 |
| 2015/0015980 A1* | 1/2015 | Iwami | ................. | H05K 9/0096 |
| | | | | 359/893 |
| 2015/0286323 A1* | 10/2015 | Iwami | ..................... | G06F 3/041 |
| | | | | 345/174 |
| 2015/0342034 A1* | 11/2015 | Iwami | ................. | H05K 1/0274 |
| | | | | 345/174 |
| 2016/0170541 A1* | 6/2016 | Iwami | ..................... | G06F 3/044 |
| | | | | 345/174 |

FOREIGN PATENT DOCUMENTS

| | | | |
|---|---|---|---|
| JP | 2009016700 | A | 1/2009 |
| JP | 2009-117683 | A | 5/2009 |
| JP | 2011-517355 | A | 6/2011 |
| JP | 2011-216379 | A | 10/2011 |
| WO | 2010099132 | A2 | 9/2010 |

OTHER PUBLICATIONS

Notification of Reasons for Refusal, dated Sep. 27, 2016, issued in corresponding JP Application No. 2015-534276, 9 pages in English and Japanese.

International Preliminary Report on Patentability issued from the International Bureau in counterpart application No. PCT/JP2014/072518, dated Mar. 10, 2016.

International Search Report of PCT/JP2014/072518 dated Nov. 11, 2014 [PCT/ISA/210].

Communication dated Jan. 19, 2018 from the State Intellectual Property Office of the P.R.C. in counterpart application No. 201480047181.1.

* cited by examiner

FIG. 11A
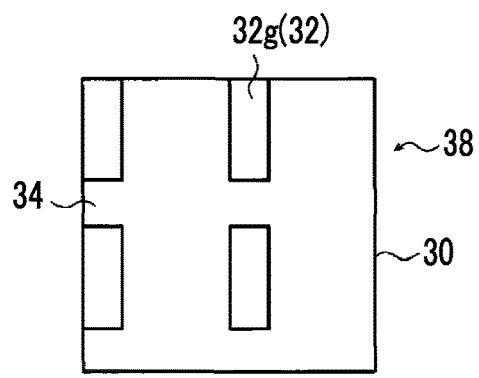
FIG. 11B
FIG. 11C
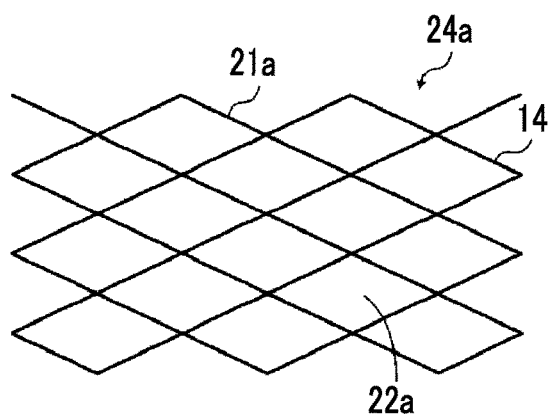
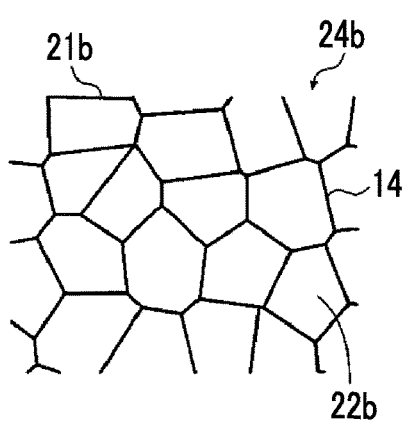
FIG. 12A
FIG. 12B
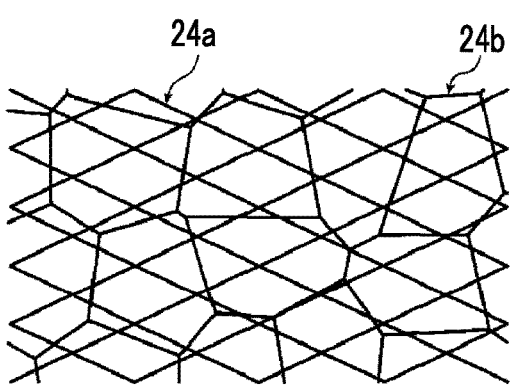
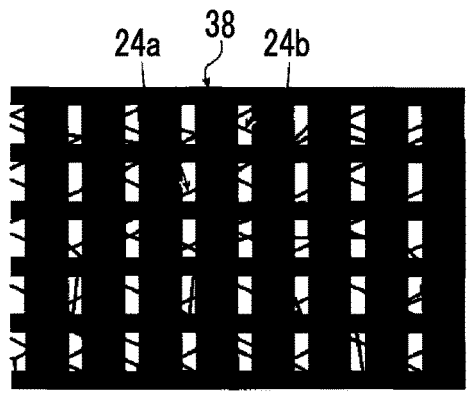

CONDUCTIVE FILM, TOUCH PANEL AND DISPLAY DEVICE EMPLOYING SAME, AND EVALUATION METHOD FOR ELECTRICALLY CONDUCTIVE FILM

CROSS-REFERENCE TO RELATED APPLICATIONS

This application is a Continuation of PCT International Application No. PCT/JP2014/072518 filed on Aug. 28, 2014, which claims priority under 35 U.S.C. § 119(a) to Japanese Application No. 2013-180708 filed on Aug. 30, 2013. The above application is hereby expressly incorporated by reference, in its entirety, into the present application.

BACKGROUND OF THE INVENTION

1. Field of the Invention

The present invention relates to a conductive film, a touch panel and a display device including the conductive film, and a conductive film evaluation method, and more particularly, to a conductive film having mesh pattern wires that is excellent regarding the visibility of moire and noise in the design of a mesh wiring pattern (hereinafter, referred to as a mesh pattern) in which a plurality of opening portions (cells) are formed by a plurality of thin metal wires, a touch panel and a display device including the conductive film, and a conductive film evaluation method.

2. Description of the Related Art

For example, a conductive film for shielding electromagnetic waves or a conductive film for a touch panel is given as an example of a conductive film which is provided on a display unit of a display device (hereinafter also referred to as a "display") (for example, see JP2009-117683A, JP2011-216379A, and JP2011-517355A).

When an object (for example, a finger) presses a surface of a touch panel, the pressed position is detected by a conductive film (sensor). The conductive film (sensor) includes a first conductive portion (electrode) and a second conductive portion (electrode) which extend in directions perpendicular to each other.

In general, an insulating transparent base is interposed between the first conductive portion and the second conductive portion.

The first conductive portion and the second conductive portion have a mesh pattern which is formed by crossing thin metal wires (wire rods). An opening portion (space) surrounded by the thin metal wires which intersect each other is also called a cell. In general, the cell has a polygonal shape or an irregular shape.

When the cells have the same predetermined shape, such as a rectangular shape, the mesh pattern is generally a regular wiring pattern, that is, a fixed pattern in which a plurality of cells having the same shape are continuously repeated. It is known that moire (interference fringe) is likely to be generated by the interference between the regular wiring pattern and a pixel array pattern (for example, a black matrix (hereinafter, referred to as a BM pattern)) of the display.

When the cells have an irregular shape or various shapes, there is no regularity (uniformity) in the shapes of the cells and the mesh pattern is generally an irregular wiring pattern, that is, a random pattern since it is difficult to repeatedly arrange cells with the same shape. It is known that, in a random pattern, a granular feeling of noise (a feeling of roughness) is likely to be perceived and transmittance is lower than that in a fixed pattern.

JP2009-117683A filed by the inventors discloses a technique which automatically selects a wiring pattern generated by wiring pattern data in which the relative distance (for example, corresponding to the frequency of moire) between the spectrum peaks of a two-dimensional Fourier spectrum (2DFFTSp) of pattern data of each of a pixel array pattern, such as a BM pattern, of a display and a wiring pattern, such as an electromagnetic wave shielding pattern, is more than a predetermined spatial frequency, for example, 8 cm$^{-1}$.

In addition, JP2009-117683A discloses a technique which, when the relative distance is not more than the predetermined spatial frequency, repeatedly performs a process of changing at least one of a rotation angle, a pitch, and a pattern width of the wiring pattern data to generate new wiring pattern data until the relative distance is more than the predetermined spatial frequency.

In JP2009-117683A, the relative distance (the frequency of moire) between the spectrum peaks of the pixel array pattern and the wiring pattern, for example, the BM pattern in which predetermined pixels are regularly repeated and the regular wiring pattern (see FIGS. 2 and 6) is more than the predetermined spatial frequency. According to this structure, it is possible to automatically select an electromagnetic wave shielding pattern which can suppress the generation of moire and avoid an increase in surface resistivity or the deterioration of transparency.

JP2011-216379A filed by the inventors discloses a transparent conductive film in which a mesh pattern (for example, a random pattern: see FIGS. 2 and 14) including a plurality of polygonal meshes is formed such that the average intensity of the centroid spectrums of each mesh in a spatial frequency band higher than a predetermined spatial frequency, for example, a spatial frequency at which a human visual response characteristic corresponds to 5% of the maximum response is higher than that in a spatial frequency band lower than the predetermined spatial frequency.

Therefore, in JP2011-216379A, it is possible to provide a transparent conductive film which can reduce the granular feeling of noise caused by the random pattern, can significantly improve the visibility of the object to be observed, and has a stable conduction performance even after being cut.

JP2011-517355A discloses a technique in which the width of a conductive micro-pattern element, such as a regular mesh pattern (for example, see FIG. 2, FIG. 11, and FIG. 25) or a random pattern (see FIG. 23) including random-shaped cells is reduced to 1 μm to 10 μm such that the conductive micro-pattern element is less likely to be seen and a structure for obscuring the conductive micro-pattern element or reducing the visibility of the conductive micro-pattern element is provided such that the conductive micro-pattern element is less likely to be seen. JP2011-517355A also discloses a pseudo random change in the conductive micro-pattern as an example of the structure.

SUMMARY OF THE INVENTION

However, in JP2009-117683A, when the wiring pattern of the conductive film is generated, a moire frequency is controlled on the basis of only the frequency information of the black matrix (BM) pattern and the wiring pattern of the display. As a result, a wiring pattern with high visibility is provided. However, the determination of whether or not moire is visually recognized is made depending on only the frequency. Therefore, in some cases, even at a frequency at which it is determined that moire is not visibly recognized, moire is visually recognized depending on the intensity of moire since the perception of moire by the human is affected by the intensity of moire as well as the frequency of moire. As a result, the visibility of moire is not sufficiently improved. In particular, in a case in which the technique disclosed in JP2009-117683A is applied to a conductive film for a touch panel, when the conductive film is pressed by a finger of a person, subtle distortion occurs between the BM pattern and the wiring patterns. As a result, there is a problem in that the visual recognition of moire due to intensity is promoted and the visibility of moire is insufficiently improved.

In JP2011-216379A, the average intensity of the centroid spectrums of each mesh in the mesh pattern of the transparent conductive film in the medium to high spatial frequency band, which is higher than a predetermined spatial frequency and in which human visual response characteristics rapidly deteriorate, is higher than that in the low spatial frequency band in which human visual response characteristics are high. As a result, the feeling of noise visually perceived by the human is reduced. However, the technique merely aims to reduce the feeling of noise of the mesh pattern in the transparent conductive film and does not lead to the suppression of moire generated between the BM pattern of the display and the mesh pattern of the transparent conductive film and to improvement in the visibility of moire.

In JP2011-517355A, when the conductive micro-pattern is a regular mesh pattern, the above-mentioned structure is provided on a transparent base different from the transparent base on which the conductive micro-pattern element is provided to simply obscure the conductive micro-pattern element or to reduce the visibility of the conductive micro-pattern element. In addition, the conductive micro-pattern element is obscured or the visibility of the conductive micro-pattern element is reduced by a pseudo random change in the conductive micro-pattern element. However, JP2011-517355A does not disclose the correspondence between the pseudo random change and the suppression of moire. In addition, there is a problem in that the pseudo random change in the conductive micro-pattern element is insufficient to improve the visibility of moire.

However, in an irregular wiring pattern such as a random pattern, noise, that is, the granular feeling of noise (the feeling of roughness) is likely to be visually recognized and transmittance is lower than that in a regular wiring pattern such as a fixed pattern. That is, when a regular wiring pattern is used, the granularity of noise is less likely to be visually recognized and transmittance increases. However, it is difficult to suppress the generation of moire. In contrast, when an irregular wiring pattern is used, the generation of moire (interference fringe) is suppressed, but the granular feeling of noise is likely to be visually recognized. In addition, transmittance is reduced. That is, an antinomic relationship is established therebetween.

In addition, if alignment (complete coincidence between the spatial frequency characteristics of the BM pattern of the display and the spatial frequency characteristics of the mesh pattern) is not performed, moire is generated due to the interference between the BM pattern of the display and the mesh pattern in principle.

In some cases, when the observation distance from the touch sensor (a display+a touch panel) changes from a predetermined observation distance, moire is seen even if the visibility of the moire is sufficiently improved.

The invention has been made in order to solve the above-mentioned problems of the related art and an object of the invention is to provide a conductive film which can suppress the generation of moire, regardless of the observation distance from a display screen of a display unit, can improve the visibility of moire which is inevitably generated in principle, can improve the visibility of moire and noise, and thus can significantly improve the visibility of the display, a touch panel and a display device including the conductive film, and a conductive film evaluation method.

In particular, another object of the invention is to provide a conductive film which is a transparent conductive film with wiring lines, can suppress the generation of moire that causes large deterioration of image quality when the conductive film is used as a touch panel electrode and is superimposed on a black matrix of a display unit of a display device, regardless of an observation distance, can improve the visibility of moire that is inevitable in principle, makes it difficult for an observer to perceive the granularity of noise, can obtain sufficient transmittance, and can significantly improve display visibility on a touch panel, a touch panel and a display device including the conductive film, and a conductive film evaluation method.

In particular, still another object of the invention is to provide a conductive film which includes first and second conductive portions (electrodes) that are provided on both main surfaces thereof and wiring patterns that are provided in the first and second conductive portions, are mesh patterns having different variations in regularity, and form a mixed mesh pattern, and makes it easy to design the wiring patterns of the conductive portions, a touch panel and a display device including the conductive film, and a conductive film evaluation method.

JP2013-020775 filed by the inventors discloses a conductive film including a wiring pattern as a technique which can significantly improve the moire visibility of a display screen of a display device (display). An evaluation value for the wiring pattern is calculated by the convolution between a visual transfer function and the two-dimensional frequency spectrum and intensity of moire which are obtained by the difference between the spatial frequency peaks of a pixel matrix of the display and a mesh pattern and the sum of peak intensities. The evaluation value is equal to or less than a predetermined value.

However, the inventors conducted a thorough study in order to achieve another technique for achieving the above-mentioned objects and found that it was possible to design a mesh pattern which was excellent in the visibility of moire when moire was generated by the interference between a regular mesh pattern and a BM pattern of a display so as to deviate from human visual sensitivity and moire was generated in principle by the interference between the mesh pattern and the BM pattern of the display if alignment (complete coincidence between the spatial frequency characteristics of the BM pattern of the display and the spatial frequency characteristics of the mesh pattern) was not performed.

The inventors found that the design concept of a method for designing a mesh pattern which was excellent in the visibility of moire, using the related art, was to maximize the spatial frequency of moire and found the frequency and the observation distance from the touch sensor (a display+a touch panel) at which moire was seen.

As a result, the inventors found the following on the basis of these findings: the technical challenge was to not generate moire caused by the interference between the regular mesh pattern and the BM pattern of the display on the high frequency side so as to deviate from human visual sensitivity; and when a high-regularity mesh pattern and a low-regularity mesh pattern which were provided on both surfaces of a conductive film and had different variations in the regularity of opening portions (cells) of meshes of the mesh patterns, for example, a regular wiring pattern and an irregular wiring pattern were combined and used, it was possible to improve the visibility of moire which was generated by the former, particularly, moire which was inevitable in principle, using the masking effect of a low-visibility noise (noise granularity) component generated by the latter. As a result, the invention was achieved.

In order to achieve the technical objects, according to a first aspect of the invention, there is provided a conductive film that is provided on a display unit of a display device. The conductive film includes a transparent base and first and second conductive portions that are formed on both surfaces of the transparent base. The first and second conductive portions include first and second wiring patterns that are formed in a mesh shape in which a plurality of opening portions are formed by a plurality of thin metal wires, respectively. The first and second wiring patterns have at least first and second patterns that have different variations in spectrums in a two-dimensional Fourier space of transmittance image data thereof, respectively. The first and second wiring patterns are superimposed as a composite wiring pattern on a pixel array pattern of the display unit. A plurality of spectrums in a two-dimensional Fourier space of transmittance image data of the pixel array pattern and a plurality of spectrums in a two-dimensional Fourier space of transmittance image data of the composite wiring pattern are excluded from a plurality of spectrums in a two-dimensional Fourier space of transmittance image data of a composite pattern of the pixel array pattern and the composite wiring pattern to extract a plurality of spectrums of only noise and moire generated by interference between the pixel array pattern and the first and second wiring patterns of the composite wiring pattern. The sum of all of the extracted plurality of spectrums is calculated, and an extraction quantitative value of the moire and the noise calculated from the sum is in a predetermined range.

In order to achieve the technical objects, according to the first aspect of the invention, there is a conductive film that is provided on a display unit of a display device. The conductive film includes a transparent base and first and second conductive portions that are formed on both surfaces of the transparent base. The first and second conductive portions include first and second wiring patterns that are formed in a mesh shape in which a plurality of opening portions are formed by a plurality of thin metal wires, respectively. The first and second wiring patterns have at least first and second patterns that have different variations in spectrums in a two-dimensional Fourier space of transmittance image data thereof, respectively. The first and second wiring patterns are superimposed as a composite wiring pattern on a pixel array pattern of the display unit. The standard deviation of spectrums in a two-dimensional Fourier space of transmittance image data of the first pattern is equal to or greater than −5.0, and the standard deviation of spectrums in a two-dimensional Fourier space of transmittance image data of the second pattern is less than −5.0.

In order to achieve the objects, according to a second aspect of the invention, there is provided a touch panel including the conductive film according to the first aspect.

In order to achieve the objects, according to a third aspect of the invention, there is provided a display device including a display unit and the conductive film according to the first aspect that is provided on the display unit.

In order to achieve the objects, according to a fourth aspect of the invention, there is provided a method for evaluating a conductive film which is provided on a display unit of a display device and includes a transparent base and first and second wiring patterns that are formed on both surfaces of the transparent base in a mesh shape in which a plurality of opening portions are formed by a plurality of thin metal wires and have at least first and second patterns having different variations in spectrums in a two-dimensional Fourier space of transmittance image data thereof, respectively. The method includes: acquiring the transmittance image data of each of the first and second wiring patterns and transmittance image data of a pixel array pattern of the display unit on which the first and second wiring patterns are superimposed as a composite wiring pattern; calculating transmittance image data of a composite pattern of the pixel array pattern and the composite wiring pattern from the acquired transmittance image data of the pixel array pattern and the first and second wiring patterns; performing two-dimensional Fourier transform for the acquired transmittance image data of each of the composite pattern, the pixel array pattern, and the composite wiring pattern to calculate a plurality of spectrums in a two-dimensional Fourier space of the transmittance image data of the composite pattern, a plurality of spectrums in a two-dimensional Fourier space of the transmittance image data of the pixel array pattern, and a plurality of spectrums in a two-dimensional Fourier space of the transmittance image data of the composite wiring pattern; excluding the plurality of spectrums of the pixel array pattern and the plurality of spectrums of the composite wiring pattern from the plurality of spectrums of the composite pattern and calculating the sum of a plurality of spectrums of only moire and noise generated by interference between the pixel array pattern and the first and second wiring patterns of the composite wiring pattern; calculating an extraction quantitative value of the moire and the noise from the obtained sum; and evaluating the conductive film in which the calculated extraction quantitative value of the moire and the noise is in a predetermined range.

In the first to fourth aspects, it is preferable that the sum of the spectrums of the moire and the noise is calculated by adding only the spectrums having a frequency (the frequency of moire that is equal to or lower than the highest frequency of moire which is defined according to the display resolution of the display unit) that is lower than a spatial frequency of the pixel array pattern. It is preferable that the sum of the spectrums of the moire and the noise is calculated by subtracting a second sum obtained by adding a plurality of spectrums of the composite wiring pattern from a first sum which is calculated in advance.

When the common logarithm of the quantitative value is E, it is preferable that the predetermined range is E<−2.150. In addition, it is preferable that the predetermined range is E<−2.20425.

It is preferable that the standard deviation of spectrums in a two-dimensional Fourier space of transmittance image data of the first pattern is equal to or greater than −5.0 and the standard deviation of spectrums in a two-dimensional Fourier space of transmittance image data of the second pattern is less than −5.0.

It is preferable that the first pattern is a regular pattern and the second pattern is an irregular pattern.

It is preferable that the opening portion is formed by crossing thin metal wires, the regular pattern is a fixed pattern which is formed in a mesh shape such that a plurality of opening portions with the same shape are continuous, and the irregular pattern is a random pattern which is formed in a mesh shape so as to include a plurality of opening portions with different shapes in a plan view.

It is preferable that the first conductive portion having the first wiring pattern is formed on an upper surface of the transparent base, the second conductive portion having the second wiring pattern is formed on a lower surface of the transparent base, the first wiring pattern is the first pattern, the second wiring pattern is the second pattern, and a width of the second wiring pattern is greater than a width of the first wiring pattern.

It is preferable that a frequency of the moire and the noise is given as a difference between a peak frequency of the composite wiring pattern and a peak frequency of the pixel array pattern and the intensity of the moire and the noise is given as the product of the peak intensity of the composite wiring pattern and the peak intensity of the pixel array pattern.

It is preferable that the transmittance image data and the intensity of the spectrum are normalized with the area of a transmittance image of the composite pattern.

It is preferable that the pixel array pattern is a black matrix pattern.

It is preferable that the thin metal wire forming the second pattern has a width of 1 µm to 5 µm.

It is preferable that an average pitch between the opening portions forming the second pattern is in a range of 100 µm to 500 µm.

It is preferable that the thin metal wire forming the first pattern has a width of 1 µm to 5 µm.

It is preferable that the opening portion forming the first pattern has a rhombic shape.

It is preferable that the thin metal wire forming the first pattern and the thin metal wire forming the second pattern are made of silver.

As described above, according to the invention, it is possible to suppress the generation of moire, regardless of the observation distance from a display screen of a display unit and to improve the visibility of moire which is inevitable in principle using a noise effect. As a result, it is possible to improve the visibility of moire and noise and thus to significantly improve the visibility of the display screen.

According to the invention, particularly, it is possible to suppress the generation of moire that causes large deterioration of image quality when a transparent conductive film having wiring lines is used as a touch panel electrode and is superimposed on a black matrix of a display unit of a display device, regardless of the observation distance, to improve the visibility of moire which is inevitable in principle, make it difficult for an observer to perceive the granularity of noise, to obtain sufficient transmittance, and to significantly improve display visibility on a touch panel.

According to the invention, particularly, when a conductive portion of a conductive film having the first and second conductive portions (electrodes) provided on the main surfaces is designed, the wiring patterns provided in the first and second conductive portions can be a mixed mesh pattern of mesh patterns having different variations in regularity. Therefore, it is possible to easily design a wiring pattern.

According to the invention, particularly, the opening portions (cells) forming one of the first and second conductive portions (electrodes) which face each other, with an insulating transparent base interposed therebetween, are arranged in a random pattern and the cells forming the other conductive portion are arranged in a regular pattern. Therefore, it is possible to suppress the generation of moire, using the electrode having a random pattern, to make it difficult for the observer to perceive the granularity of noise, using the electrode having a fixed pattern, and to obtain sufficient transmittance.

BRIEF DESCRIPTION OF THE DRAWINGS

FIG. 11(A) is a partial enlarged view schematically illustrating an example of the pixel array pattern of the display unit to which the conductive film according to the invention is applied and FIGS. 11(B) and 11(C) are partial enlarged views schematically illustrating examples of a wiring pattern of a conductive film which is superimposed on the pixel array pattern illustrated in FIG. 11(A).

FIG. 12(A) is a partial enlarged view schematically illustrating a composite wiring pattern of the wiring patterns illustrated in FIGS. 11(B) and 11(C) and FIG. 12(B) is a diagram schematically illustrating a composite pattern of the composite wiring pattern illustrated in FIG. 12(A) and the pixel array pattern illustrated in FIG. 11(A) on a different scale.

11(A), the resolution of a display, and the spectrum of the pixel array pattern of the display.

Figure 15:
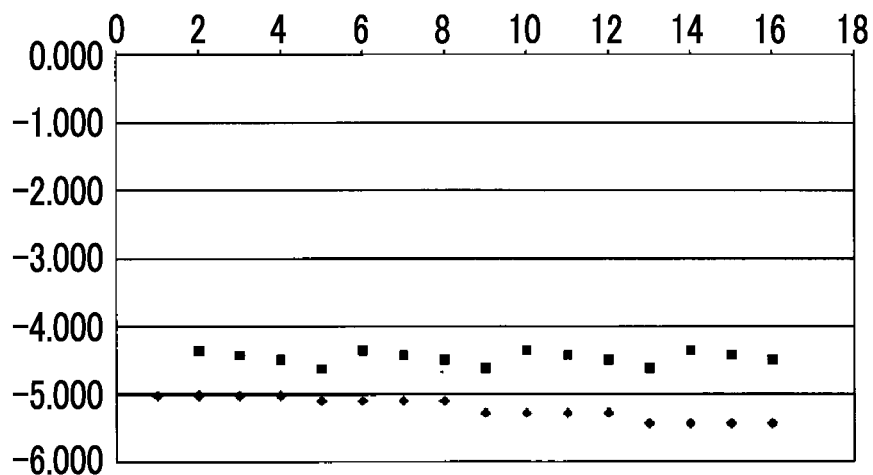

FIG. 15 is a graph illustrating the standard deviation of a spectrum distribution in a two-dimensional Fourier space of the wiring pattern of the conductive film used in each example.

Figure 16:
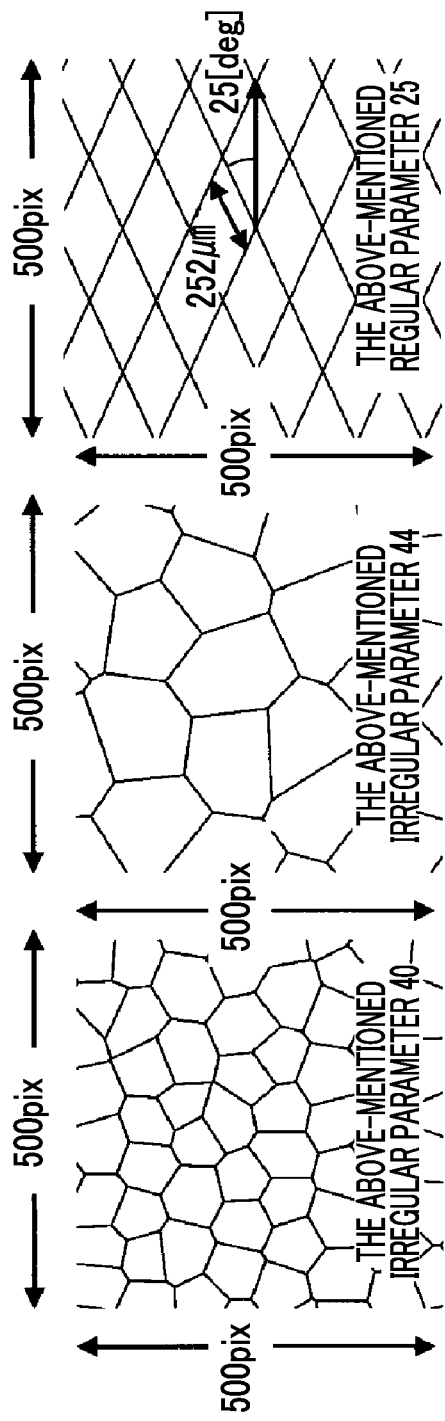

FIGS. 16(A), 16(B), and 16(C) are diagrams schematically illustrating examples of the wiring pattern of the conductive film used in each example.

Figure 17:
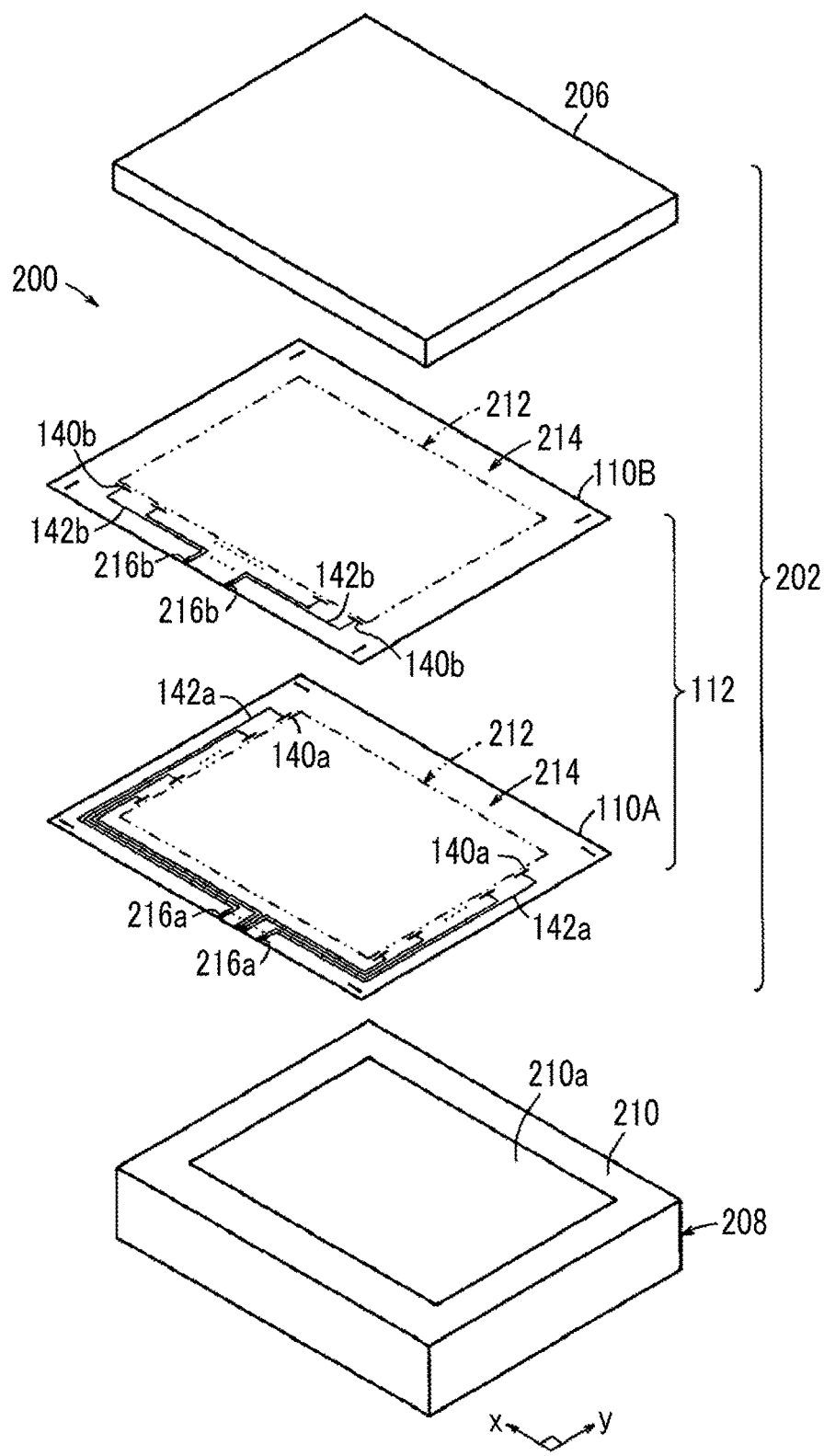

FIG. 17 is an exploded perspective view illustrating a main portion of a touch panel including a conductive film according to a second embodiment of the invention.

Figure 18:
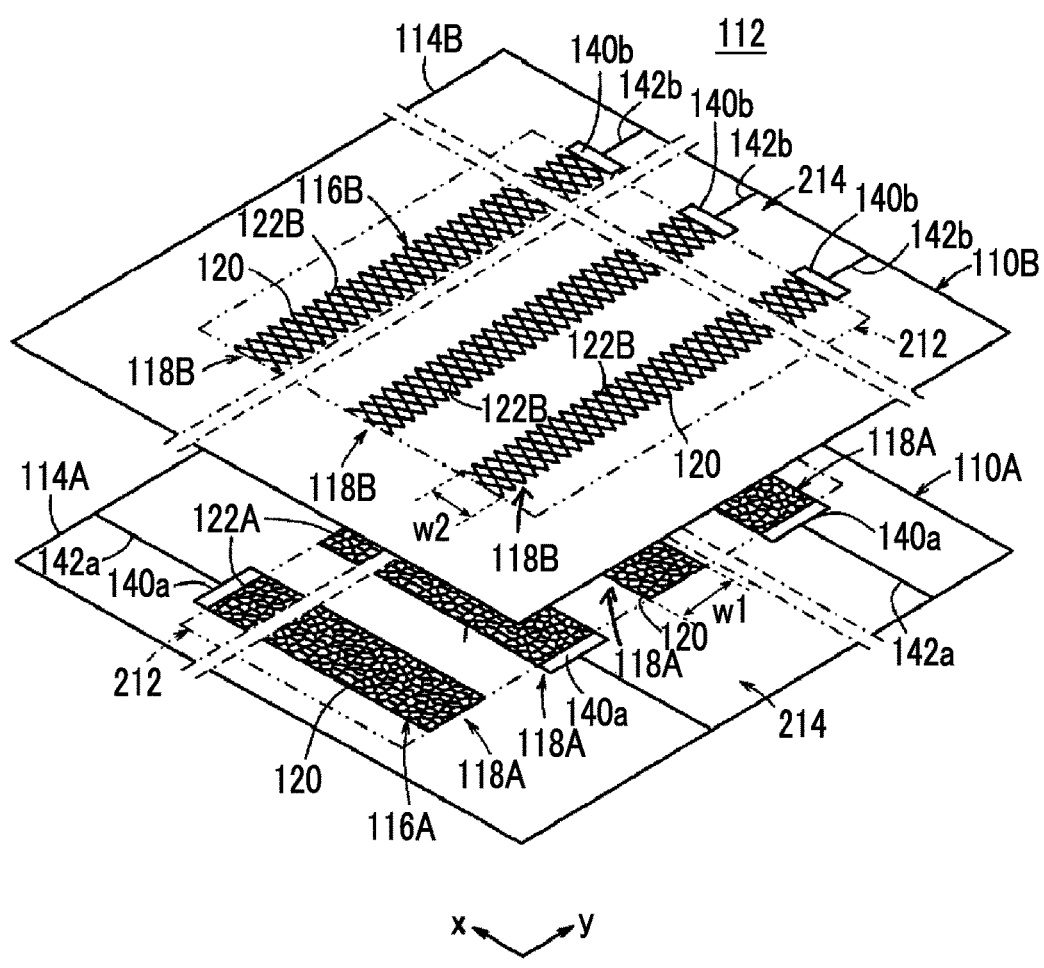

FIG. 18 is an exploded perspective view illustrating a main portion of the conductive film forming the touch panel illustrated in FIG. 17.

Figure 19:
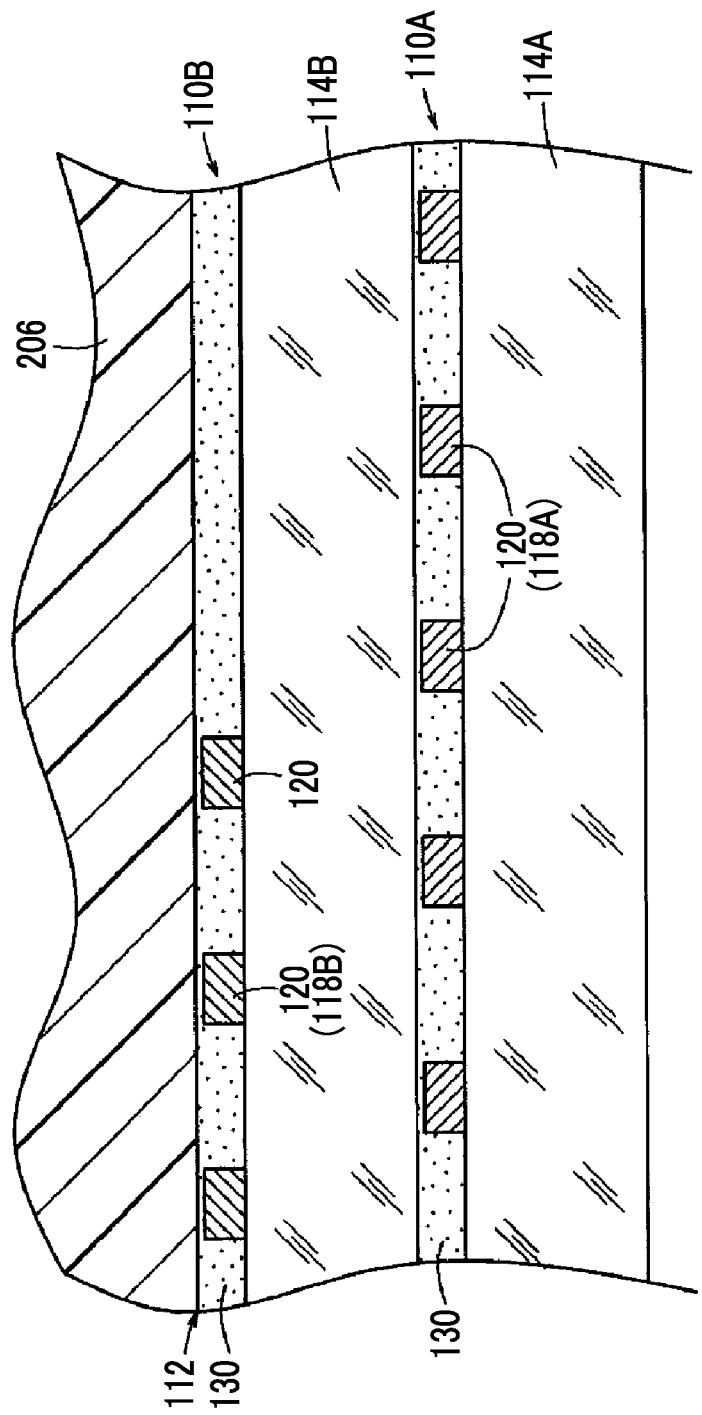

FIG. 19 is a vertical cross-sectional view schematically illustrating the conductive film illustrated in FIG. 18.

Figure 20:
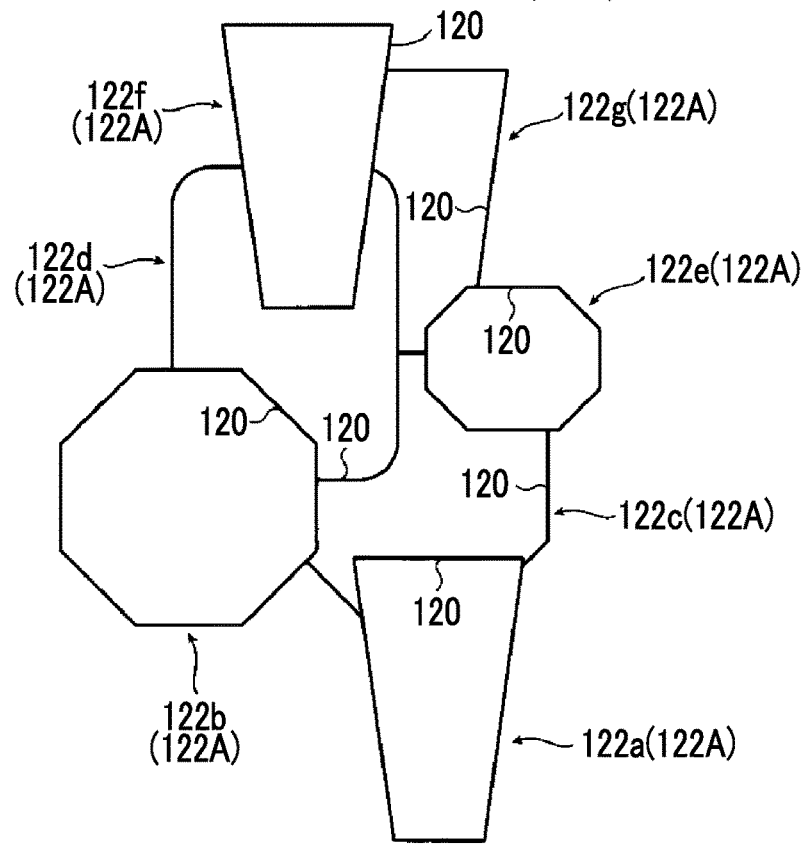

FIG. 20 is a plan view schematically illustrating an example of cells of a first conductive portion (electrode) which is formed in the conductive film illustrated in FIG. 19.

Figure 21:
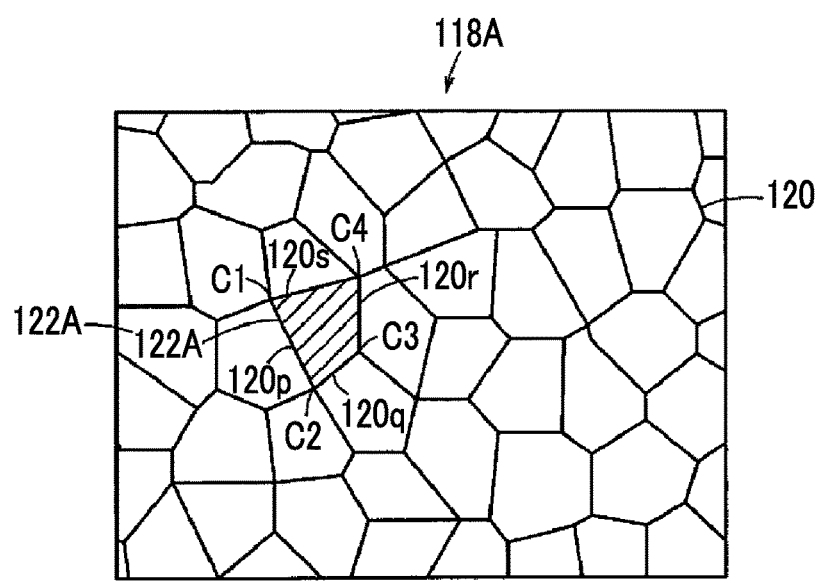

FIG. 21 is a plan view schematically illustrating another example of the cells of the first conductive portion (electrode) illustrated in FIG. 19.

Figure 22:
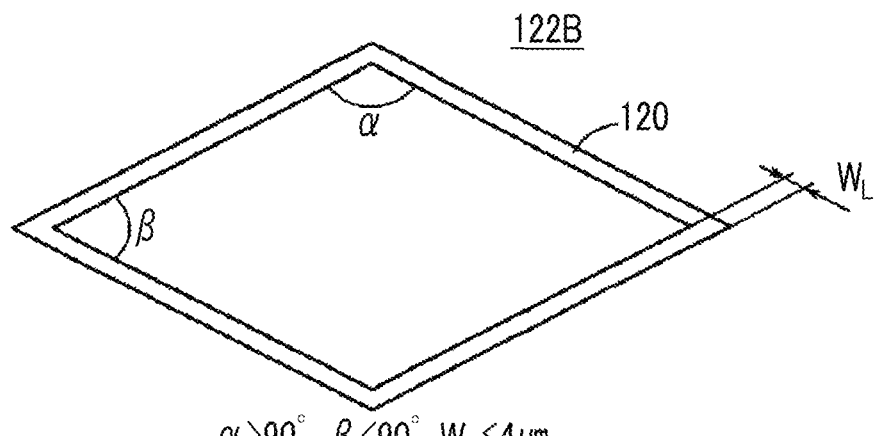

FIG. 22 is a plan view schematically illustrating an example of cells of a second conductive portion (electrode) which is formed in the conductive film illustrated in FIG. 19.

Figure 23:
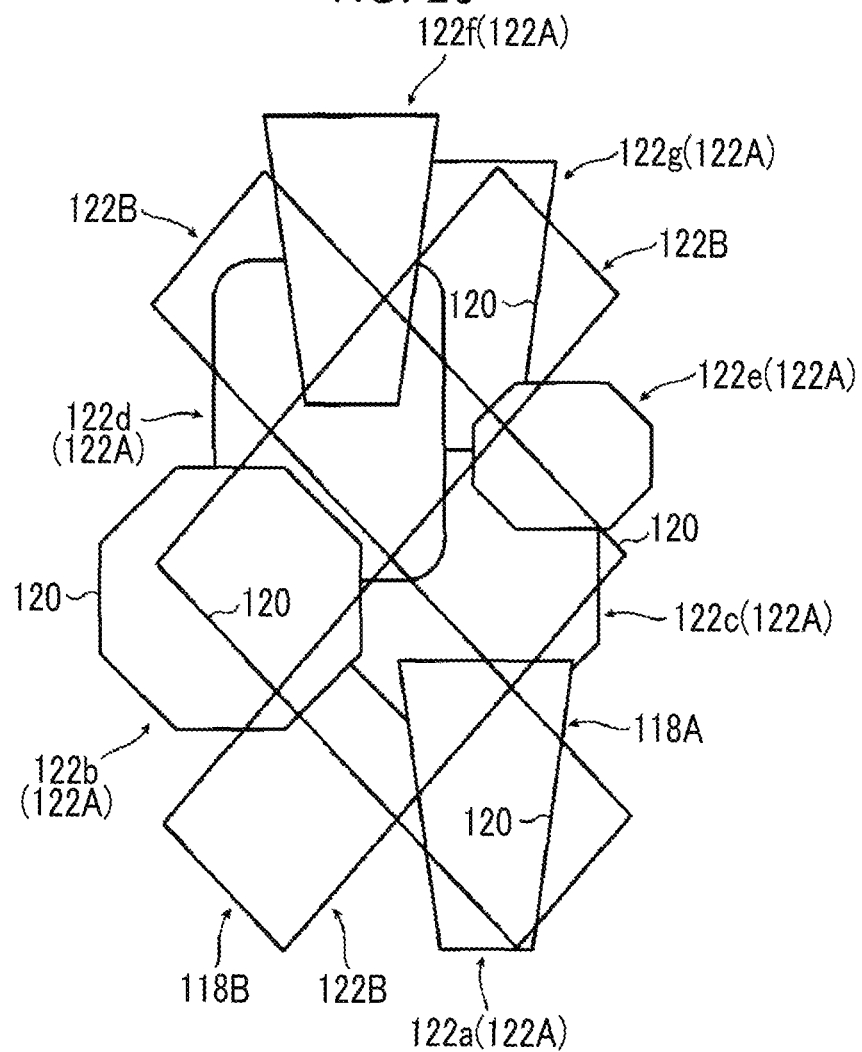

FIG. 23 is a plan view schematically illustrating an overlap portion between the first conductive portion (electrode) illustrated in FIG. 21 and the second conductive portion (electrode) illustrated in FIG. 22.

Figure 24:
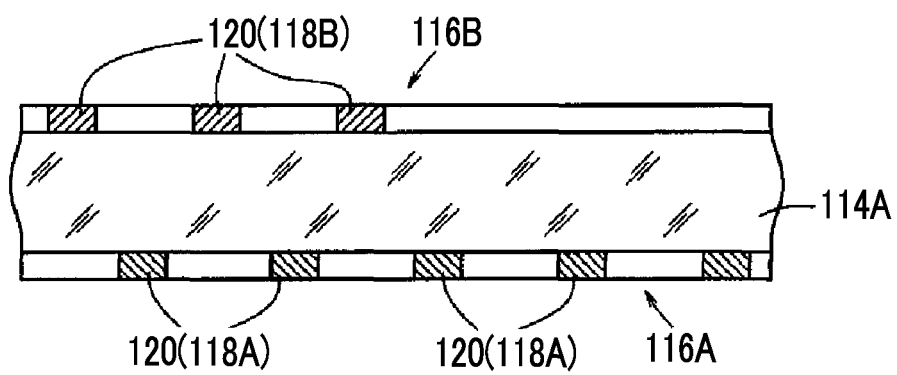

FIG. 24 is a vertical cross-sectional view schematically illustrating a conductive film according to another embodiment which is different from the conductive film illustrated in FIG. 19.

Figure 25:
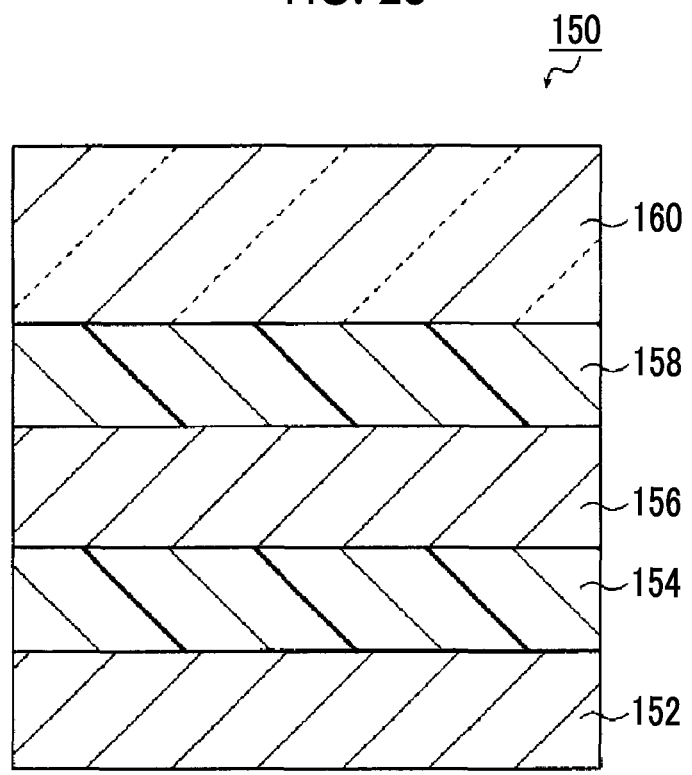

FIG. 25 is a vertical cross-sectional view schematically illustrating a conductive film for evaluation.

DESCRIPTION OF THE PREFERRED EMBODIMENTS

Hereinafter, a conductive film and a conductive film evaluation method according to the invention will be described in detail with reference to preferred embodiments illustrated in the accompanying drawings.

In the following description, a conductive film for a touch panel is given as a representative example of the conductive film according to the invention. However, the invention is not limited thereto and any conductive film may be used as long as it includes a conductive portion having wiring patterns, which have different variations in regularity and are provided on both surfaces of a transparent base, and is provided on a display unit of a display device, such as a liquid crystal display (LCD), a plasma display panel (PDP), an organic electroluminescence (EL) display (GELD), or an inorganic EL display. For example, an electromagnetic-wave shielding conductive film may be used.

Figure 1:
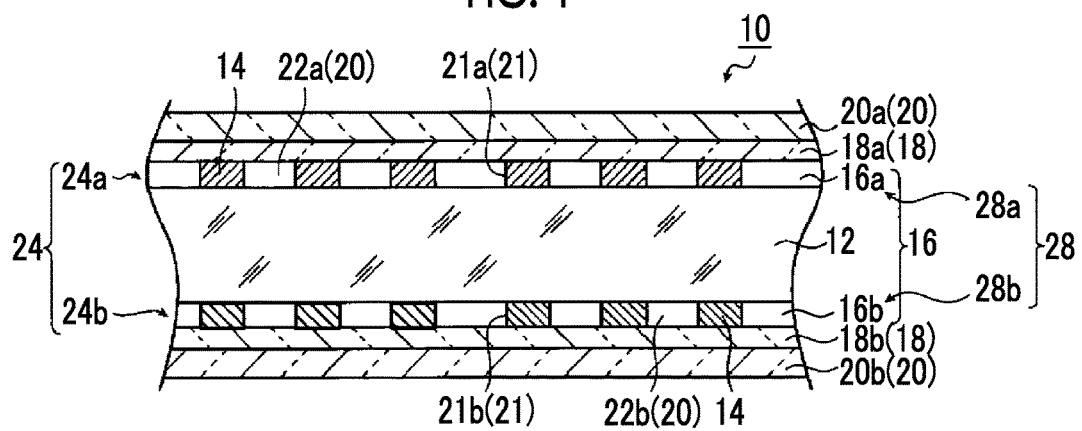
FIG. 1 is a partial cross-sectional view schematically illustrating an example of a conductive film according to a first embodiment of the invention.
Figure 2:
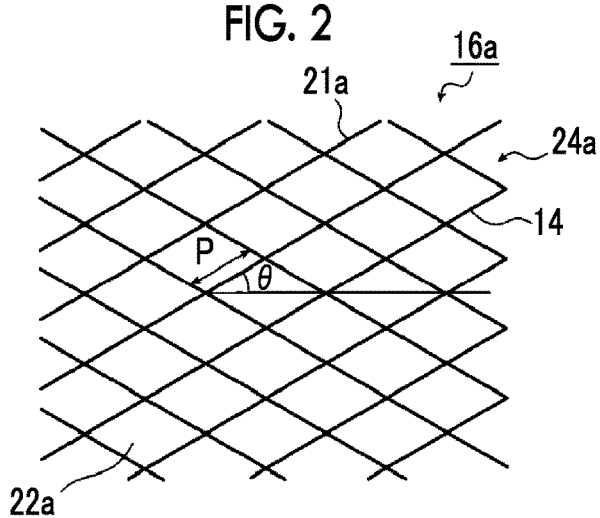
FIG. 2 is a plan view schematically illustrating an example of a wiring pattern of one conductive portion of the conductive film illustrated in FIG. 1.
Figure 3:
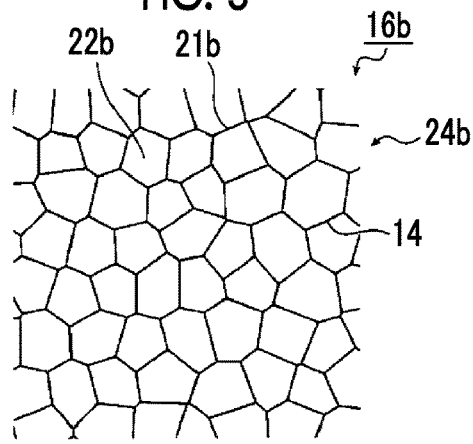
FIG. 3 is a plan view schematically illustrating an example of a wiring pattern of the other conductive portion of the conductive film illustrated in FIG. 1.

FIG. 1 is a partial cross-sectional view schematically illustrating an example of a conductive film according to a first embodiment of the invention. FIGS. 2 and 3 are plan views schematically illustrating examples of the wiring patterns of one conductive portion and the other conductive portion of the conductive film illustrated in FIG. 1, respectively.

As illustrated in these drawings, a conductive film 10 according to this embodiment is provided on a display unit of a display device, has wiring patterns that are excellent in the suppression of moire with respect to a black matrix (BM) of the display unit, particularly, wiring patterns that are optimized in terms of the visibility of moire with respect to the BM pattern when it is superimposed on the BM pattern. The conductive film 10 includes a transparent base 12, a first conductive portion (electrode) 16a that is formed on one surface (an upper surface in FIG. 1) of the transparent base 12 and includes a plurality of thin wires made of metal (hereinafter, referred to as "thin metal wires") 14, a first protective layer 20a that is bonded to the substantially entire surface of the first conductive portion 16a through a first adhesive layer 18a so as to cover the thin metal wires 14, a second conductive portion (electrode) 16b that is formed on the other surface (a lower surface in FIG. 1) of the transparent base 12 and includes a plurality of thin meal wires 14, and a second protective layer 20b that is bonded to the substantially entire surface of the second conductive portion 16b through a second adhesive layer 18b.

In the following description, when the first conductive portion 16a and the second conductive portion 16b are generically described, they are simply referred to as a conductive portion 16. When the first adhesive layer 18a and the second adhesive layer 18b are generically described, they are simply referred to an adhesive layer 18. When the first protective layer 20a and the second protective layer 20b are generically described, they are simply referred to a protective layer 20.

The transparent base 12 is made of a material that has an insulating property and high translucency. For example, the transparent base 12 can be made of a resin, glass, or silicon. Examples of the resin include polyethylene terephthalate (PET), polymethyl methacrylate (PMMA), polypropylene (PP), and polystyrene (PS).

The thin metal wire 14 is not particularly limited as long as it is made of a metal material with high conductivity. For example, the thin metal wire 14 can be made of a gold (Au), silver (Ag), or copper (Cu) wire rod. It is preferable that the width of the thin metal wire 14 is small in terms of visibility. For example, the width of the thin metal wire 14 is preferably equal to or less than 30 μm. When the thin metal wire 14 is used for a touch panel, the width of the thin metal wire 14 is preferably equal to or greater than 0.1 μm and equal to or less than 15 μm, more preferably equal to or greater than 1 μm and equal to or less than 9 μm, and most preferably equal to or greater than 2 μm and equal to or less than 7 μm.

The conductive portion 16 (16a and 16b) has a wiring pattern 24 (24a and 24b) which is formed by mesh wires 21 (21a and 21b) obtained by arranging a plurality of thin metal wires 14 in a mesh shape. Specifically, the wiring pattern 24 (24a and 24b) is a mesh pattern in which opening portions (cells) 22 (22a and 22b) which have a predetermined shape and are formed by intersecting a plurality of thin metal wires 14 are arranged.

As illustrated in FIG. 2, the first conductive portion 16a is a conductive layer 28a (see FIG. 1) including the mesh-shape wiring pattern 24a that is formed by the thin metal wires 14 and the opening portions (cells) 22a between adjacent thin metal wires 14. The wiring pattern 24a is a regular wiring pattern, that is, a so-called fixed pattern in which a plurality of rhombic opening portions 22a with the same shape are regularly repeated.

The second conductive portion 16b is a conductive layer 28b (see FIG. 1) including the mesh-shape wiring pattern 24b that is formed by the thin metal wires 14 and the opening portions (cells) 22b between adjacent thin metal wires 14. As illustrated in FIG. 3, the wiring pattern 24b is an irregular wiring pattern, that is, a so-called random pattern in which a plurality of opening portions 22b that have different shapes in a plan view are connected to each other.

In the example illustrated in FIG. 2, the wiring pattern 24a is a fixed pattern in which the mesh shape of the opening portion 22a is a rhombus. In the example illustrated in FIG. 3, the wiring pattern 24b is a random pattern in which the mesh shape of the opening portion 22b is irregular. However, the invention is not limited thereto. The wiring pattern 24a and the wiring pattern 24b may be mesh patterns having different variations in the regularity of the shape of the opening portion (cell) 22 (22a and 22b) or a repetitive pattern. One of the wiring patterns 24a and 24b may be a mesh pattern with high regularity and the other wiring pattern may be a mesh pattern with low regularity.

The mesh pattern with high regularity (hereinafter, referred to as a high-regularity pattern) is likely to have a specific peak in a two-dimensional Fourier space of the transmittance image data thereof. Therefore, a variation is large in the mesh pattern. For this reason, in the high-regularity pattern, the standard deviation of spectrums in the two-dimensional Fourier space (spectrums obtained by two-dimensional Fourier transform) is preferably equal to or greater than −5.0. The mesh pattern with low regularity (hereinafter, referred to as a low-regularity pattern) is less likely to have a specific peak in a two-dimensional Fourier space of the transmittance image data thereof. Therefore, a variation is small in the mesh pattern. For this reason, in the low-regularity pattern, the standard deviation of spectrums in the two-dimensional Fourier space (spectrums obtained by two-dimensional Fourier transform) is preferably less than −5.0.

The high-regularity pattern and the low-regularity pattern have different variations in pattern regularity. The opening portion 22 may have any shape as long as a composite wiring pattern of the high-regularity pattern and the low-regularity pattern can form a wiring pattern in which the visibility of moire is optimized with respect to a predetermined pixel array (BM) pattern of the display device, which will be described below. That is, the opening portions 22 of the wiring pattern 24 may have any of a polygonal shape having at least three sides, a circular shape, an elliptical shape, and a closed unfixed shape. In addition, the opening portions 22 may have the same mesh shape or different mesh shapes. For example, the opening portions 22 can have the same polygonal shape or different polygonal shapes. Examples of the polygonal shape include a triangle, such as a regular triangle or an isosceles triangle, a quadrangle (rectangle), such as a square (square lattice) or a rectangle, a pentagon, and a hexagon (regular hexagon). That is, the high-regularity pattern and the low-regularity pattern may be any pattern as long as it can form a composite wiring pattern in which there is a level difference between variations in pattern regularity and the visibility of moire is optimized with respect to a predetermined BM pattern.

In addition, in the wiring pattern 24, the side (mesh wire 21) of the thin metal wire 14 forming the opening portion 22 may have a break. The shape of the mesh wiring pattern of the conductive film disclosed in JP2012-276175 filed by the inventors can be applied as the shape of the mesh wiring pattern having the break.

The high-regularity pattern used as the wiring pattern 24a is preferably a fixed wiring pattern formed by a regular array of the opening portions 22a which have the same shape. In addition to the rhombic pattern illustrated in FIG. 2 in which the rhombic opening portions 22a are regularly arranged, for example, wiring patterns 24a illustrated in FIGS. 4(A) and 4(B), that is, a square lattice pattern in which square opening portions are regularly arranged and a regular hexagonal pattern in which square hexagonal opening portions are regularly arranged, can be used.

Figure 5A:
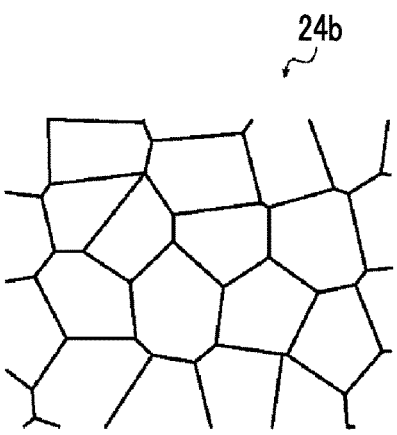
FIGS. 5(A) and 5(B) are plan views schematically illustrating other examples of the wiring pattern of the other conductive portion of the conductive film illustrated in FIG. 1.
Figure 5B:
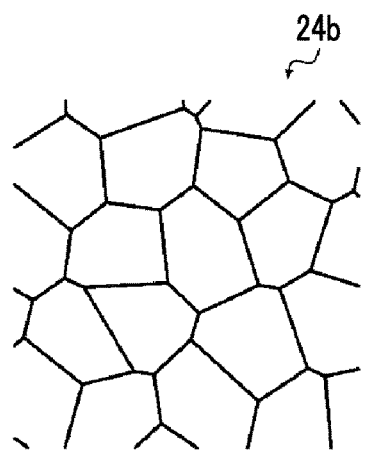

The low-regularity pattern used as the wiring pattern 24b is preferably a random wiring pattern formed by an array of the opening portions 22b which have different shapes. In addition to the random pattern illustrated in FIG. 3 in which the opening portions 22b having a polygonal shape are arranged, for example, a random pattern in which the opening portions 22 having different shapes are randomly arranged, such as wiring patterns 24b illustrated in FIGS. 5(A) and 5(B), can be used. For example, as the random pattern, a random pattern can be used which is created by a stained glass function of Adobe Photoshop (registered trademark).

In the conductive film 10 according to the embodiment illustrated in FIG. 1, in FIG. 1, the wiring pattern 24a with high regularity is provided in the first conductive portion 16a on the upper side (observation side) of the transparent base 12 and the wiring pattern 24b with low regularity is provided in the second conductive portion 16b on the lower side (display side) of the transparent base 12. However, the invention is not limited thereto. Inversely, in FIG. 1, the wiring pattern 24b with low regularity may be provided in the first conductive portion 16a on the upper side (observation side) of the transparent base 12 and the wiring pattern 24a with high regularity may be provided in the second conductive portion 16b on the lower side (display side) of the transparent base 12.

Each of the wiring patterns 24a and 24b which are respectively provided in the first conductive portion 16a and the second conductive portion 16b may be at least one layer, or the first conductive portion 16a and the second conductive portion 16b may include other wiring pattern layers. That is, at least one layer of the wiring patterns 24a and 24b may be provided in the first conductive portion 16a and the second conductive portion 16b, respectively.

In the conductive film 10 according to this embodiment, at least a portion of the first conductive portion 16a and the second conductive portion 16b may be a dummy electrode portion which is a predetermined distance away from the conductive portions 16a and 16b, is electrically insulated from the conductive portions 16a and 16b, and includes the thin metal wire 14. The provision of the dummy electrode portion makes it possible to arrange the mesh wires 21 (21a and 21b) of the first conductive portion 16a and the second conductive portion 16b so as to correspond to each other. Therefore, it is possible to control scattering caused by the thin metal wires in the surface (for example, the upper surface or the lower surface in FIG. 1) of the transparent base 12 and thus to improve electrode visibility.

As described above, the first protective layer 20a is bonded to the substantially entire surface of the conductive layer 28a which is the first conductive portion 16a by the first adhesive layer 18a so as to cover the thin metal wire 14 of the first conductive portion 16a. The second protective layer 20b is bonded to the substantially entire surface of the conductive layer 28b which is the second conductive portion 16b by the second adhesive layer 18b so as to cover the thin metal wire 14 of the second conductive portion 16b.

Here, examples of the material forming the adhesive layer 18 (the first adhesive layer 18a and the second adhesive layer 18b) include a wet laminate adhesive, a dry laminate adhesive, and a hot-melt adhesive. The first adhesive layer 18a and the second adhesive layer 18b may be made of the same material or different materials.

The protective layer 20 (the first protective layer 20a and the second protective layer 20b) is made of a material having high translucency, such as a resin, glass, or silicon, similarly to the transparent base 12. The first protective layer 20a and the second protective layer 20b may be made of the same material or different materials.

It is preferable that both a refractive index n1 of the first protective layer 20a and a refractive index n2 of the second protective layer 20b are equal or close to a refractive index n0 of the transparent base 12. In this case, both the relative refractive index nr1 of the transparent base 12 with respect to the first protective layer 20a and the relative refractive index nr2 of the transparent base 12 with respect to the second protective layer 20b are close to 1.

In the specification, the refractive index means a refractive index for light with a wavelength of 589.3 nm (D-line of sodium). For example, the refractive index of a resin is defined by ISO 14782:1999 (corresponding to JIS K 7105) that is an international standard. In addition, the relative refractive index nr1 of the transparent base 12 with respect to the first protective layer 20a is defined as nr1=(n1/n0) and the relative refractive index nr2 of the transparent base 12 with respect to the second protective layer 20b is defined as nr2=(n2/n0).

Here, it is preferable that the relative refractive index nr1 and the relative refractive index nr2 are equal to or greater than 0.86 and equal to or less than 1.15 and preferably equal to or greater than 0.91 and equal to less than 1.08.

It is possible to further improve the visibility of moire by limiting the relative refractive index nr1 and the relative refractive index nr2 to the above-mentioned ranges to control the transmittance of light between the transparent base 12 and the protective layer 20 (20a and 20b).

Figure 6:
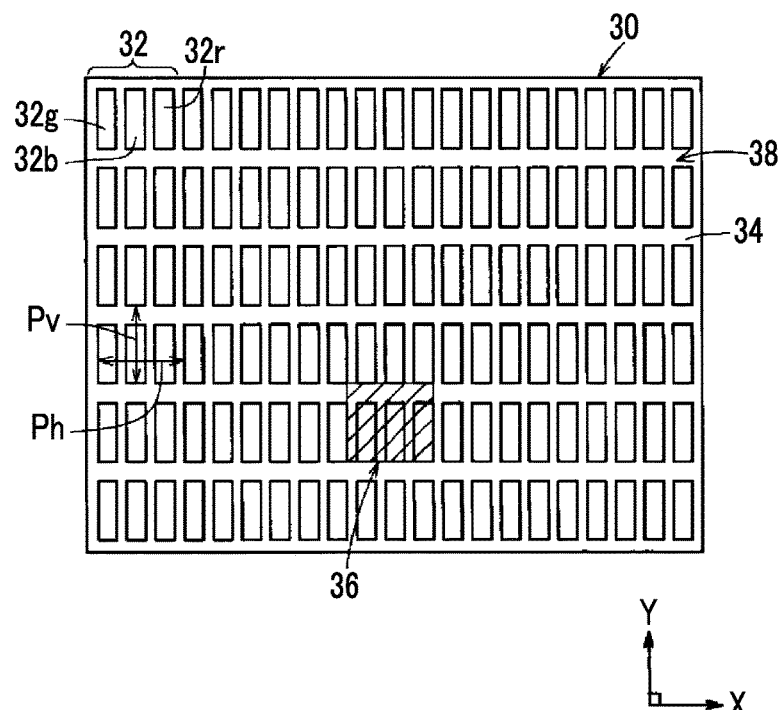
FIG. 6 is a diagram schematically illustrating an example of a pixel array pattern of a portion of a display unit to which the conductive film according to the invention is applied.

The conductive film 10 according to the first embodiment of the invention is applied to, for example, a touch panel 44 (see FIG. 7) of a display unit 30 (display), a portion of which is schematically illustrated in FIG. 6. When a mesh wiring pattern (metal mesh pattern) is formed by the thin metal wires 14 required to form a touch sensor of the touch panel 44, two types of mesh patterns having different variations in pattern regularity, that is, the high-regularity pattern and the low-regularity pattern are used. Here, the high-regularity pattern, preferably, a regular mesh pattern interferes with a black matrix (hereinafter, referred to as a BM) of a display device (display) to causes moire, similarly to the related art. The low-regularity pattern, preferably, an irregular mesh pattern interferes with the BM to generate noise. In the conductive film according to the invention, the two patterns are combined with each other. Therefore, a high-frequency moire caused by the high-regularity pattern is less likely to be seen by the masking effect of the noise component generated by the low-regularity pattern. As in the invention, when moire is masked to improve the visibility of moire, it is important to balance moire caused by the interference between the regular mesh pattern and the BM with noise caused by the interference between the irregular mesh pattern and the BM in order to further optimize the visibility of moire. In the invention, it is preferable to quantify the characteristics of each pattern and define the quality of the finally obtained image with a numerical value.

The conductive film 10 according to the invention has a composite wiring pattern of two types of mesh patterns having different variations in pattern regularity. The composite wiring pattern is optimized with respect to the pixel array (BM) pattern of the display unit 30 in terms of the visibility of moire. In the invention, the wiring pattern which is optimized with respect to the BM (pixel array) pattern in terms of the visibility of moire means a combination of the high-regularity pattern and the low-regularity pattern which can prevent a high-frequency moire that is inevitably generated by the interference between a predetermined BM pattern and the high-regularity pattern from being seen, using the masking effect of the noise component that is simultaneously generated by the interference between the BM pattern and the low-regularity pattern, or a composite wiring pattern of the high-regularity pattern and the low-regularity pattern. In the invention, two or more optimized combinations or composite wiring patterns can be ranked from a combination (composite wiring pattern) in which moire is least likely to be visually perceived to a combination (composite wiring pattern) in which moire is less likely to be seen. In addition, it is possible to determine a combination (composite wiring pattern) of the wiring patterns in which moire is least likely to be visually perceived.

The optimization of the visibility of moire in the composite wiring pattern with respect to a predetermined BM pattern will be described in detail below.

The conductive film according to the invention has the above-mentioned basic structure.

FIG. 6 is a diagram schematically illustrating an example of the pixel array pattern of a portion of the display unit to which the conductive film according to the invention is applied.

In the display unit 30 which is partially illustrated in FIG. 6, a plurality of pixels 32 are arranged in a matrix to form a predetermined pixel array pattern. One pixel 32 includes three sub-pixels (a red sub-pixel 32r, a green sub-pixel 32g, and a blue sub-pixel 32b) which are arranged in the horizontal direction. One sub-pixel has a rectangular shape that is long in the vertical direction. Three sub-pixels 32r, 32g, and 32b have the same or similar rectangular shape. The arrangement pitch between the pixels 32 in the horizontal direction (horizontal pixel pitch Ph) and the arrangement pitch between the pixels 32 in the vertical direction (vertical pixel pitch Pv) are substantially equal to each other. That is, the shape (see a hatched region 36) formed by one pixel 32 and a black matrix (BM) 34 (pattern material) which surrounds the one pixel 32 is a square. In addition, the aspect ratio of one pixel 32 is not 1 and the length of the pixel in the horizontal (lateral) direction is larger than that in the vertical (longitudinal) direction.

Figure 8A:
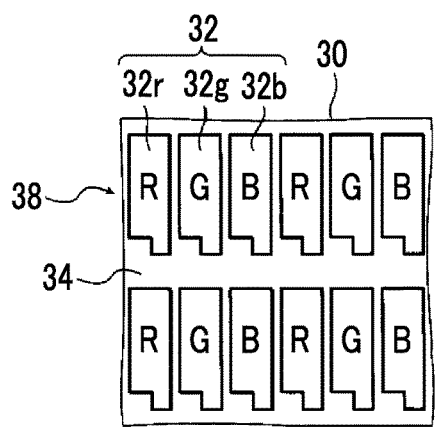
FIGS. 8(A) and 8(C) are partial enlarged views schematically illustrating examples of the pixel array pattern of the display unit to which the conductive film according to the invention is applied and FIGS. 8(B) and 8(D) are diagrams schematically illustrating pixel array patterns when only a G-channel sub-pixel is used in FIGS. 8(A) and 8(C).
Figure 8B:
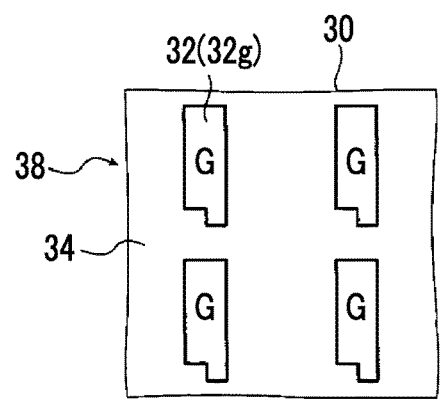
Figure 8C:
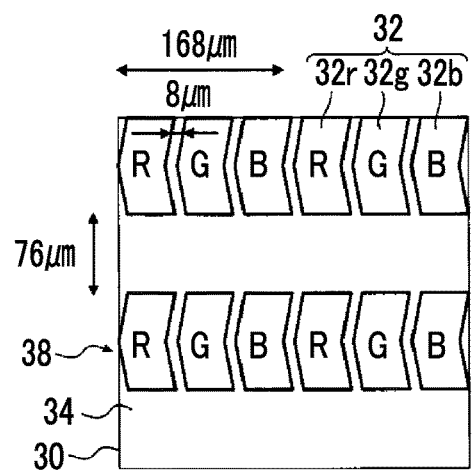

In the example illustrated in FIG. 6, one sub-pixel (32r, 322, or 32b) has a rectangular shape. However, the invention is not limited thereto. For example, the shape of the sub-pixel may be a rectangle in which an end is cut out as illustrated in FIG. 8(A), a vertically long stripe which is curved or bent at a predetermined angle as illustrated in FIG. 8(C), or a vertically long stripe which is curved. In addition, the end of the sub-pixel may be cut out in any shape. For example, the sub-pixel may have various shapes illustrated in FIGS. 9(A) to 9(H) or any known pixel shape according to the related art. The sub-pixels 32r, 32g, and 32b in one pixel 32 may have the same shape or different shapes.

The pixel pitch (horizontal and vertical pixel pitches Ph and Pv) may have any value corresponding to the resolution of the display unit 30. For example, the pixel pitch can be in the range of 84 μm to 264 μm.

As can be seen from FIG. 6, the pixel array pattern formed by the sub-pixels 32r, 32g, and 32b in each of the plurality of pixels 32 is defined by a BM pattern 38 of the BM 34 which surrounds each of the sub-pixels 32r, 32g, and 32b. When the display unit 30 and the conductive film 10 are superimposed on each other, moire is generated by the interference between the BM pattern 38 of the BM 34 of the display unit 30 and the composite wiring pattern (wiring patterns 24a and 24b) of the conductive film 10. Strictly, the BM pattern 38 is a reverse pattern of the pixel array pattern. However, in this embodiment, the BM pattern 38 is treated as the same pattern as the pixel array pattern.

For example, when the conductive film 10 is arranged on a display panel of the display unit 30 having the BM pattern 38 which is formed by the BM 34, the wiring pattern 24 of the conductive film 10 is optimized with respect to the BM (pixel array) pattern 38 in terms of the visibility of moire. Therefore, there is little spatial frequency interference between the arrangement cycle of the pixel 32 and the arrangement of the thin metal wires 14 of the conductive film 10 and the generation of moire is suppressed.

The display unit 30 illustrated in FIG. 6 may be a display panel such as a liquid crystal panel, a plasma panel, an organic EL panel, or an inorganic EL panel.

Figure 7:
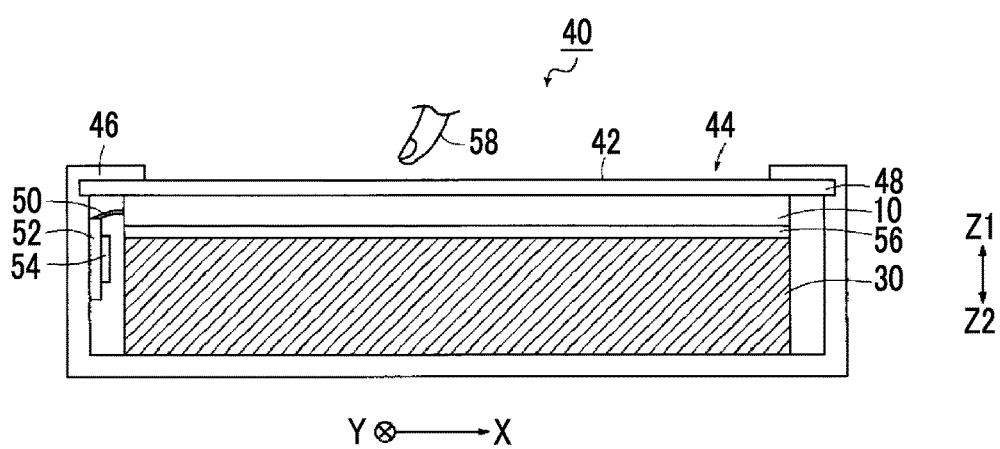
FIG. 7 is a cross-sectional view schematically illustrating an example of a display device into which the conductive film illustrated in FIG. 1 is incorporated.

Next, a display device into which the conductive film according to the invention is incorporated will be described with reference to FIG. 7. In FIG. 7, a projection-type capacitive touch panel into which the conductive film 10 according to the invention is incorporated is given as a representative example of the display device 40. However, the invention is not limited thereto.

As illustrated in FIG. 7, the display device 40 includes the display unit 30 (see FIG. 6) that can display a color image and/or a monochrome image, a touch panel 44 that detects a contact position from an input screen 42 (in the direction of an arrow Z1), and a housing 46 that accommodates the display unit 30 and the touch panel 44. The user can access the touch panel 44 through a large opening portion which is provided in one surface (in the direction of the arrow Z1) of the housing 46.

The touch panel 44 includes a cover member 48 that is provided on one surface (in the direction of the arrow Z1) of the conductive film 10, a flexible substrate 52 that is electrically connected to the conductive film 10 through a cable 50, and a detection control unit 54 that is provided on the flexible substrate 52, in addition to the conductive film 10 (see FIG. 1).

The conductive film 10 is bonded to one surface (in the direction of the arrow Z1) of the display unit 30 through an adhesive layer 56. The conductive film 10 is provided on a display screen, with the other main surface (a surface close to the second conductive portion 16b) facing the display unit 30.

The cover member 48 covers one surface of the conductive film 10 and functions as the input screen 42. In addition, the cover member 48 prevents the direct contact of a contact body 58 (for example, a finger or a stylus pen), which makes it possible to suppress, for example, the occurrence of a scratch or the adhesion of dust, and to stabilize the conductivity of the conductive film 10.

The cover member 48 may be made of, for example, glass or a resin film. One surface (in the direction of an arrow Z2) of the cover member 48 may be coated with, for example, a silicon oxide and bonded to one surface (in the direction of the arrow Z1) of the conductive film 10. The conductive film 10 and the cover member 48 may be bonded to each other in order to prevent damage due to, for example, friction.

The flexible substrate 52 is an electronic substrate having flexibility. In this example, the flexible substrate 52 is fixed to the inner wall of the side surface of the housing 46. However, the flexible substrate 52 may be fixed at any other positions. The detection control unit 54 forms an electronic circuit that checks a change in the capacitance between the contact body 58 and the conductive film 10 and detects the contact position (or a neighboring position) when the contact body 58, which is a conductor, comes into contact with (or approaches) the input screen 42.

The display device to which the conductive film according to the invention is applied has the above-mentioned basic structure.

Next, in the invention, a process will be described which optimizes the visibility of moire in a combination (composite wiring pattern) of the wiring patterns of the conductive film with respect to a predetermined BM pattern of the display device will be described. That is, a process will be described which evaluates and determines a composite wiring pattern (a combination of the wiring patterns) that is optimized with respect to a predetermined BM pattern of the display device such that moire is not seen by the human eye in the conductive film according to the invention.

Figure 10:
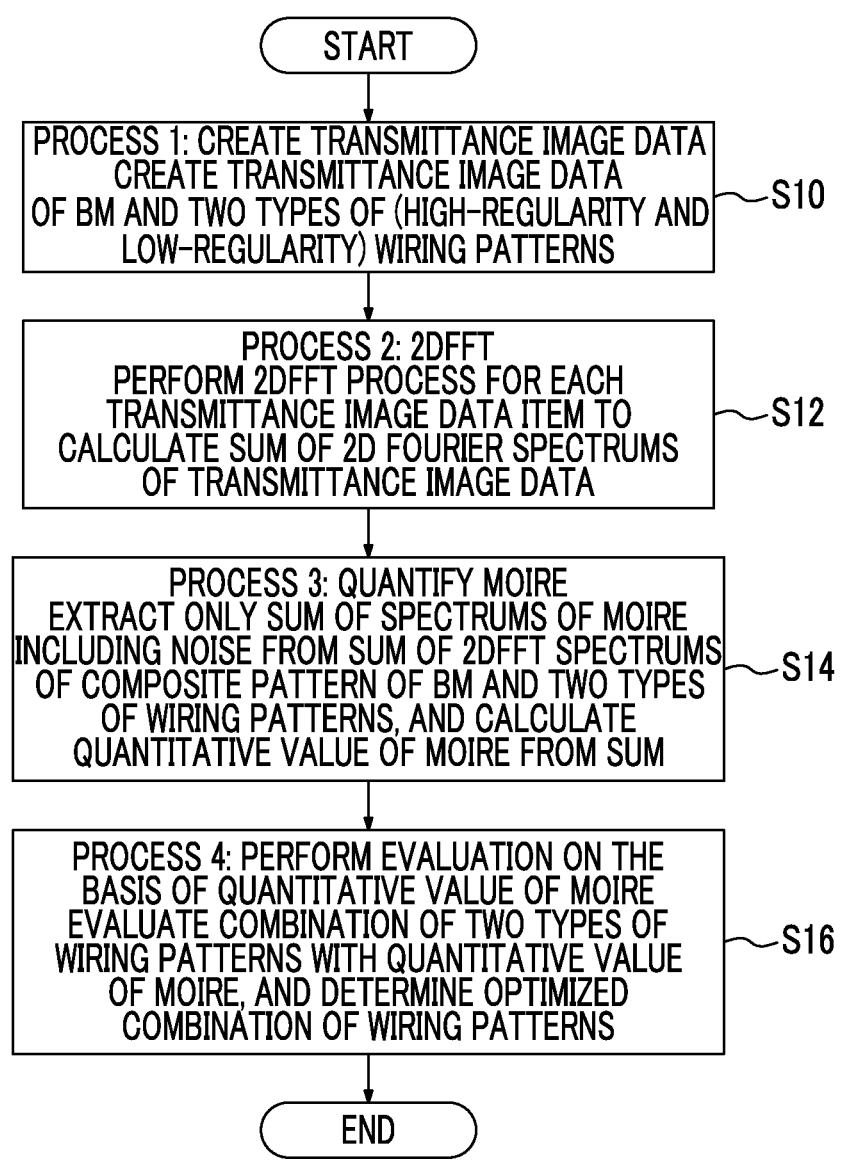
FIG. 10 is a flowchart illustrating an example of a method for evaluating a wiring line in the conductive film according to the invention.

FIG. 10 is a flowchart illustrating an example of a method for evaluating the conductive film according to the invention.

The method for evaluating the wiring pattern of the conductive film according to the invention excludes all of a plurality of spectrums (having a frequency and intensity) in a two-dimensional Fourier space of a BM (pixel array) pattern of the display unit of the display device and all of a plurality of spectrums (having a frequency and intensity) in a two-dimensional Fourier space of a composite wiring pattern (combination) of two types of wiring patterns having different variations in the conductive film from all of a plurality of spectrums (having a frequency and intensity) in a two-dimensional Fourier space of a composite pattern of the BM pattern and the composite wiring pattern of the conductive film, which is obtained by frequency analysis using fast Fourier transform (FFT) for the BM pattern and the composite wiring pattern to extract a plurality of spectrums of only moire and noise generated by the interference of the BM pattern and the composite wiring pattern, calculates the sum of all of the extracted plurality of spectrums, calculates an extraction quantitative value of the moire and noise from the sum, and evaluates and determines a combination of two types of wiring patterns that have different variations and form a composite wiring pattern in which the calculated quantitative value is in a predetermined range as a combination of two types of wiring patterns which is optimized such that moire is not seen.

In the touch panel 44 using the metal mesh conductive film 10 in the display device 40 having the structure illustrated in FIG. 7, light which finally reaches the eye of the observer is represented by the addition of light emitted from the BM 34 and the transmittance of the conductive film 10. Therefore, this is equivalent to convolution in a frequency space (Fourier space). In the invention, FFT is generally used to extract the spectrums (frequency/intensity) of moire and noise. However, the spectrum (frequency/intensity) of a target greatly changes depending on the method used. Therefore, the following processes are defined.

In the invention, first, as Process 1, the images (transmittance image data: 0-1) of the BM pattern and two types of wiring patterns are created. That is, as illustrated in FIG. 10, in Step S10, the transmittance image data of the BM pattern 38 (BM 34) (see FIG. 11(A)) of the display unit 30 of the display device 40 illustrated in FIG. 7 and the transmittance image data of the wiring patterns 24a and 24b (thin metal wire 14) (see FIGS. 11(B) and 11(C)) of the conductive film 10 are created and acquired. When the transmittance image data of the BM pattern 38 and the transmittance image data of the wiring patterns 24a and 24b are provided or stored in advance, the transmittance image data may be acquired from the prepared and stored transmittance image data.

Figure 8D:
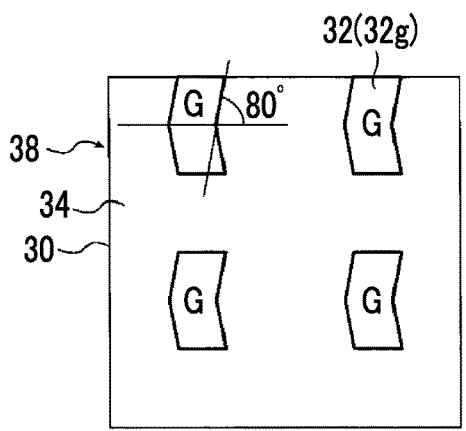
Figure 9D:
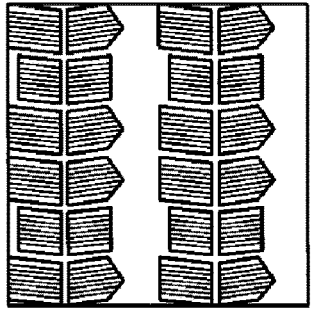
FIGS. 9(A) to 9(H) are partial enlarged views schematically illustrating other examples of the pixel array pattern of the display unit to which the conductive film according to the invention is applied.
Figure 9C:
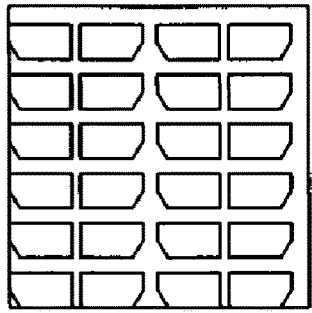
Figure 9B:
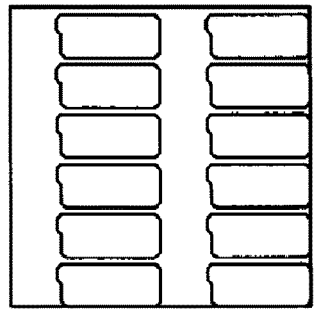
Figure 9A:
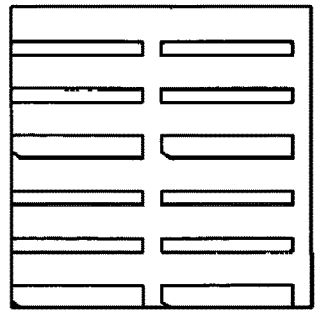
Figure 9H:
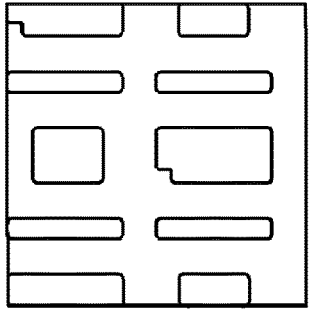
Figure 9G:
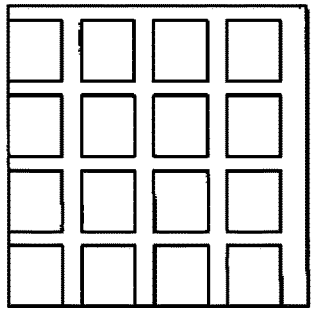
Figure 9F:
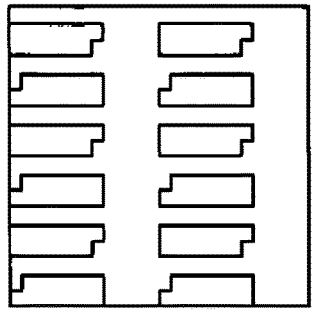
Figure 9E:
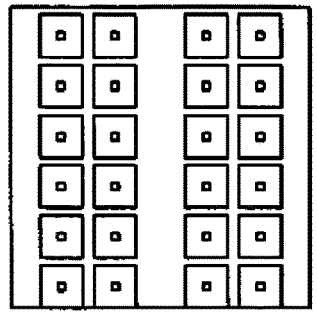

For example, as illustrated in FIG. 6 and FIGS. 8(A) and 8(C), the BM pattern 38 of the display unit 30 can be a pattern in which one pixel 32 includes sub-pixels 32r, 32g, and 32b of three colors, that is, R, G, and B. However, when a single color is used, for example, when only a G-channel sub-pixel 32g is used as illustrated in FIG. 11(A) and FIGS. 8(B) and 8(D), it is preferable that the transmittance image data of an R channel and a B channel is 0. In the invention, the image data of the BM 34, that is, the transmittance image data of the BM pattern 38 is not limited to the simple pattern having rectangular openings as illustrated in FIG. 6 and FIG. 11(A). However, the BM pattern which does not have the rectangular openings of the BM 34 may be used or a BM pattern having arbitrary BM openings may be designated and used. The BM pattern 38 is not limited to the simple pattern having the rectangular openings illustrated in FIG. 6 and FIG. 11(A). For example, the BM pattern 38 may be a pattern which has substantially rectangular (with a cutout) openings (sub-pixels 32r, 32g, and 32b) of the BM 34 as illustrated in FIGS. 8(A) and 8(B), a pattern in which one pixel 32 has strip-shaped openings bent at a predetermined angle and includes sub-pixels 32r, 32g, and 32h of three colors, that is, R, G, and B, as illustrated in FIGS. 8(C) and 8(D), a pattern which has curved strip-shaped openings, or a pattern which has hooked openings.

Figure 4A:
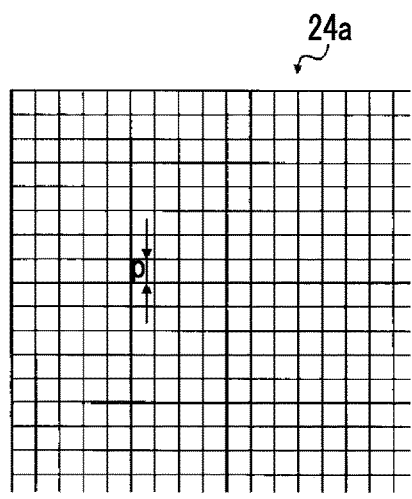
FIGS. 4(A) and 4(B) are plan views schematically illustrating other examples of the wiring pattern of the one conductive portion of the conductive film illustrated in FIG. 1.
Figure 4B:
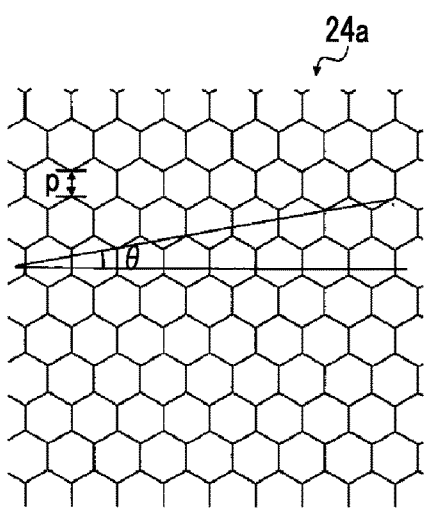

For example, as illustrated in FIG. 2 and FIG. 11(B), of two types of wiring patterns which have different variations in the conductive film 10, the wiring pattern 24a having higher regularity can be a rhombic pattern in which the thin metal wire 14, which is a wiring line, is inclined at a predetermined angle, for example, an angle of less than 45° [deg] with respect to a horizontal line. As described above, the opening portion 22a of the wiring pattern 24a may have any shape. For example, the shape of the opening portion 22a may be a square (square lattice) or a regular hexagon as illustrated in FIGS. 4(A) and 4(B), and the square lattice may be inclined at an angle of 45° [deg].

For example, as illustrated in FIG. 3 and FIG. 11(C), of two types of wiring patterns which have different variations in the conductive film 10, the wiring pattern 24b having lower regularity can be a random pattern in which the opening portions 22b having different shapes are arranged. As described above, the opening portion 22b of the wiring pattern 24b may have any shape. For example, the opening portion 22b may have random shapes illustrated in FIGS. 5(A) and 5(B).

When the transmittance image data of the BM pattern 38 is created, it has, for example, a high resolution of 12700 dpi and the size of the transmittance image data is defined such that a pixel size is, for example, 9944 (pixels)×9944 (226×44 (the number of repetitions)) (pixels). Here, the size of the image data is closest to, for example, 10000×10000 and the sufficient size thereof is an integral multiple of the size of the image data (BM pattern 38) of the BM 34. The reason is that, during the addition of each image size, the error of periodic image data is the minimum when two-dimensional fast Fourier transform (2DFFT) is performed. The resolution of the sub-pixels 32g of the BM 34 in the display unit (display) 30 illustrated in FIG. 11(A) is, for example, 112 dpi and the opening portion has, for example, a size of 28 (pixels)×77 (pixels).

The transmittance image data of the BM pattern 38 is created.

Then, the transmittance image data of the wiring patterns 24a and 24b is created. Two types of image data of the wiring patterns are prepared and are finally added to each other. The wiring patterns 24a and 24b are mesh patterns illustrated in FIGS. 11(B) and 11(C), respectively, and have an image resolution of 12700 dpi which is the same as the resolution of the BM pattern 38. The wiring patterns 24a and 24b have a pixel size of, for example, 9944 (pixels)×9944 (pixels), which is the same as the pixel size of the BM pattern 38. The width of the thin metal wire 14 in the wiring patterns 24a and 24b is, for example, 4 μm.

The regular mesh pattern illustrated in FIG. 11(B) is a rhombic pattern. The pitch (p: see FIG. 2) indicates an oblique side (p: see FIG. 2) and is, for example, 252 μm. The opposite angle (θ: see FIG. 2) is, for example, 50° [deg].

The irregular mesh pattern illustrated in FIG. 11(C) is a random pattern. The random pattern is created by, for example, the strained glass function of Adobe Photoshop (registered trademark).

The obtained transmittance image data of the wiring patterns 24a and 24b illustrated in FIGS. 11(B) and 11(C) are added and the transmittances of the composite wiring pattern illustrated in FIG. 12(A) are multiplied to calculate image data.

Then, the image data obtained by multiplying the transmittances of the composite wiring pattern of two patterns illustrated in FIG. 12(A) and the transmittance image data of the BM pattern 38 are added and the transmittances of the composite pattern of three patterns illustrated in FIG. 12(B) are multiplied to calculate image data. The image data obtained by multiplying the transmittances of the composite pattern illustrated in FIG. 12(B) includes the spatial frequency of moire including noise.

Then, as Process 2, two-dimensional fast Fourier transform (2DFFT (base 2)) is performed for various kinds of transmittance image data created in Process 1. That is, as illustrated in FIG. 10, in Step S12, a 2DFFT (base 2) process is performed for each of the transmittance image data of the BM pattern 38, the image data obtained by multiplying the transmittances of the composite wiring patterns of two types of wiring patterns 24a and 24b, and the image data obtained by multiplying the transmittances of the composite pattern of the BM pattern 38 and the composite wiring pattern created in Step S10 to calculate a plurality of 2DFFT spectrums (frequency and intensity) in the two-dimensional Fourier spectrum (Fourier space) of the transmittance image data of the BM pattern 38, the image data obtained by multiplying the transmittances of the composite wiring pattern of two types of wiring patterns 24a and 24b, and the image data obtained by multiplying the transmittances of the composite pattern of the BM pattern 38 and the composite wiring pattern.

Figure 13A:
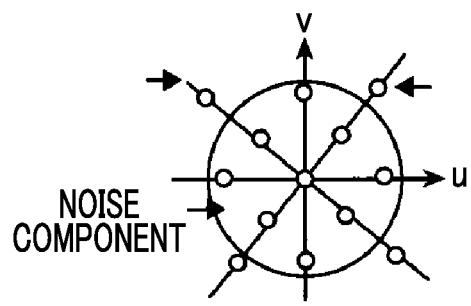
FIGS. 13(A) and 13(B) are graphs schematically illustrating two-dimensional Fourier spectrums of transmittance image data of the composite wiring pattern illustrated in FIG. 12(A) and the pixel array pattern illustrated in FIG. 11(A), respectively.

FIG. 13(A) is a diagram schematically illustrating a plurality of spectrum peaks and noise components of the spectrum in the two-dimensional Fourier space of the image data obtained by multiplying the transmittances of the composite wiring pattern. In FIG. 13(A), a straight line represented by an arrow indicates the vector direction of the fundamental frequency of the wiring pattern 24a which is a regular pattern. Here, a plurality of spectrum peaks of the spectrum illustrated in FIG. 13(A) are mainly generated by the regular wiring pattern 24a and the noise component which is locally present in a circle illustrated in FIG. 13(A) is mainly generated by the irregular wiring pattern 24b.

Figure 13B:
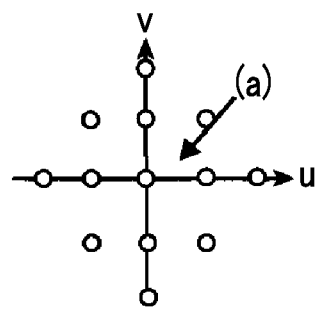

FIG. 13(B) is a diagram schematically illustrating the spectrum peaks of a plurality of spectrums in the two-dimensional Fourier space of the obtained transmittance image data of the BM pattern 38.

Here, the spectrum frequency and spectrum intensity of each spectrum peak in the BM pattern 38 and the wiring pattern 24*a* of the composite wiring pattern are calculated and acquired as follows.

First, in the acquisition of the spectrum frequency, the peak may be calculated considering the BM pattern 38 and the wiring pattern 24*a* of the composite wiring pattern. The frequency peak is calculated from the fundamental frequencies of the BM pattern 38 and the wiring pattern 24*a*. The reason is that, since the transmittance image data subjected to the 2DFFT process is a discrete value, the spectrum frequency depends on the reciprocal of the image size. The position of the frequency peak can be represented by a combination of independent two-dimensional fundamental frequency vector components. Therefore, as illustrated in FIGS. 13(A) and 13(B), the obtained peak positions have a lattice shape.

It is preferable that the obtained peak intensity is normalized with the area of the image (image size). In the above-mentioned example, it is preferable that the peak intensity be normalized with an image size of 4944×4944 (Parseval's theorem).

Each spectrum of the irregular wiring pattern 24*b* of the composite wiring pattern is less likely to have a specific peak. Therefore, as illustrated in FIG. 13(A), the spectrums are distributed as noise components with low intensity in a predetermined range (a circle with a predetermined radius) having the origin as the center in the uv plane.

When convolution is performed between a 2DFFT spectrum of the composite wiring pattern of two types of wiring patterns 24*a* and 24*b* which is schematically illustrated in FIG. 13(A) and a 2DFFT spectrum of the BM pattern 38 which is schematically illustrated in FIG. 13(B), a mixed spectrum of the spectrum of moire, the 2DFFT spectrum of the composite wiring pattern, and the 2DFFT spectrum of the BM pattern 38 is obtained.

In other words, a plurality of spectrums in the two-dimensional Fourier space which are obtained by 2DFFT for the image data obtained by multiplying the transmittances of the obtained composite pattern includes the spectrum of moire, the 2DFFT spectrum of the composite wiring pattern, and the 2DFFT spectrum of the BM pattern 38. Therefore, the 2DFFT spectrum of the composite pattern also includes a plurality of spectrums of moire including noise.

Then, as Process 3, moire is quantified and the extraction quantitative value of moire including noise is calculated. That is, as illustrated in FIG. 10, in Step S14, the absolute values of the 2DFFT spectrums of the image data (see FIG. 12(A)) which is obtained by multiplying the transmittances of the composite pattern of the BM pattern 38 and the composite wiring pattern of two types of wiring patterns 24*a* and 24*b* calculated in Step S12 are normalized with the image size (4944×4944) as described above and are added in an image region to acquire the sum of the 2DFFT spectrums (absolute values) of the composite pattern.

The obtained sum of the 2DFFT spectrums of the composite pattern includes the spectrum of moire, the 2DFFT spectrum of the composite wiring pattern, and the 2DFFT spectrum of the BM pattern 38 as described above.

Therefore, then, the 2DFFT spectrum of the composite wiring pattern and the 2DFFT spectrum of the BM pattern 38 are excluded from the sum of the 2DFFT spectrums of the composite pattern to extract only the spectrums (frequency and intensity) of moire including noise. Here, the absolute value of the spectrum intensity of moire is treated.

The sum of only the extracted spectrums of moire (moire/noise) including noise is calculated.

The common logarithm of the obtained sum of only the spectrums of moire/noise is calculated and the extraction quantitative value (common logarithm) of moire/noise is obtained.

A detailed method which calculates the sum of only the spectrums of moire/noise from the sum of the 2DFFT spectrums of the composite pattern will be described.

However, in the actual space, moire is originally generated by the multiplication of the transmittance image data items of the wiring pattern 24*a* of the composite wiring pattern and the BM pattern 38. Therefore, in a frequency space, convolution is performed therebetween. However, since the peak spectrums (frequency and intensity) of the two-dimensional Fourier spectrums of both the BM pattern 38 and the composite wiring pattern (wiring pattern 24*a*) have been calculated in Step S12, the difference (the absolute value of the difference) between the frequency peaks of the two spectrums is calculated, the calculated difference is used as the frequency of moire, the product of two combinations of vector intensities of the patterns is calculated, and the calculated product is used as the intensity (absolute value) of moire. In this way, it is possible to calculate the spectrum of moire.

Here, the difference between the frequency peaks in the intensity characteristics of the two-dimensional Fourier spectrums of the composite wiring pattern (wiring pattern 24*a*) and the BM pattern 38 which are respectively illustrated in FIGS. 13(A) and 13(B) corresponds to a relative distance between the positions of the frequency peaks of the two patterns on a frequency coordinate system in the intensity characteristics obtained by superimposing the intensity characteristics of the two-dimensional Fourier spectrums of the two patterns.

As illustrated in FIGS. 13(A) and 13(B), each of the two-dimensional Fourier spectrums of the composite wiring pattern (wiring pattern 24*a*) and the BM pattern 38 includes a plurality of spectrum peaks. Therefore, a plurality of differences between the frequency peaks, which are the relative distances, that is, a plurality of frequencies of moire are calculated. When each of the two-dimensional Fourier spectrums of the two patterns includes a plurality of spectrum peaks, a large number of moire frequencies are calculated and a large number of moire intensities are calculated.

In order to calculate the sum of only the spectrums of moire/noise, it is necessary to remove the peaks (see FIG. 13(B)) of the 2DFFT spectrum of the BM pattern 38 and the peaks (see FIG. 13(A)) of the 2DFFT spectrum of the composite wiring pattern, particularly, the wiring pattern 24*a*, which is a regular mesh pattern, from the sum of the 2DFFT spectrums of the composite pattern.

First, the peaks of the 2DFFT spectrum of the BM pattern 38 can be removed as follows.

A display resolution has been determined in the display device. Therefore, the highest spatial frequency (fundamental frequency) which can be displayed by the display is determined according to the resolution. Since moire which has a frequency higher than the highest spatial frequency is not displayed on the display, the moire does not need to be evaluated in the invention. Therefore, it is possible to define the highest frequency of moire according to the display resolution.

Figure 14:
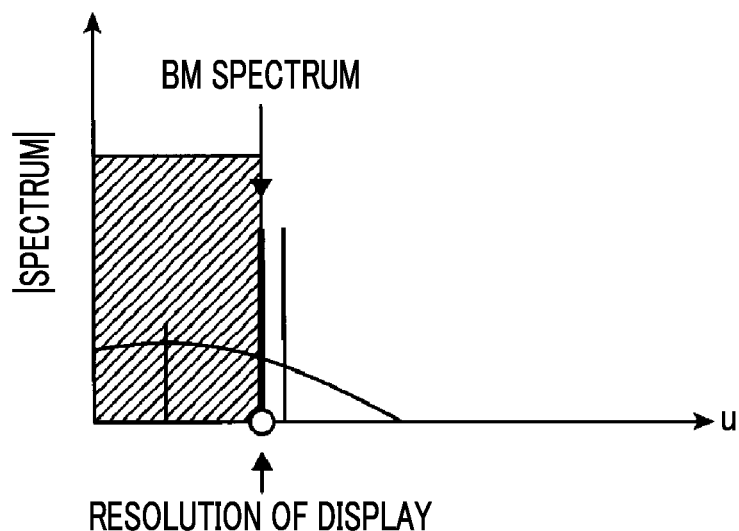
FIG. 14 is a graph schematically illustrating the relationship between the spectrum of moire generated by interference between the composite wiring pattern illustrated in FIG. 12(A) and the pixel array pattern illustrated in FIG.

That is, as illustrated in FIG. 14, when the sum of the spectrums including moire is calculated, it is possible to calculate the sum of only the spectrums with a frequency lower than the spatial frequency of the BM pattern 38. In this case, the sum of the spectrums including moire does not include the spectrum peak of the BM pattern 38. This shows that the frequency of more required to quantify the visibility of moire can be limited to a pixel size or less by the pixel masking effect of the BM pattern 38.

In this way, it is possible to calculate the sum (BM pattern peak removed sum) of the spectrums including moire by removing the peaks of the 2DFFT spectrum of the BM pattern 38 from the sum of the 2DFFT spectrums of the composite pattern.

When the pitch between the pixels in the BM pattern 38 of the display is, for example, p (μm), the highest frequency of more to be considered in the invention can be 1000/(2p). In this case, in the invention, of the frequency and intensity of moire calculated from the spectrum peaks of two two-dimensional Fourier spectrums, the moire to be evaluated in the invention can have a frequency that is equal to or lower than the highest frequency of moire, 1000/(2p), which is defined according to the display resolution.

Next, the peak of the 2DFFT spectrum of the composite wiring pattern (wiring pattern 24*a*) can be removed from the sum of the 2DFFT spectrums of the composite pattern as follows.

The peak of the spectrum of the composite wiring pattern (wiring pattern 24*a*) included in the 2DFFT spectrum of the composite pattern is represented by the convolution between the spectrum of the composite wiring pattern illustrated in FIG. 13(A) and the center value (the value (average value) of the origin of the uv coordinate system) of the spectrum of the BM pattern 38 represented by (a) in FIG. 13(B). Therefore, the spectrum intensity of the spectrum peak of the composite wiring pattern is the sum of the spectrum peak of each composite wiring pattern and the center value of the spectrum of the BM pattern 38 represented by (a) in FIG. 13(B). The sum of the composite wiring patterns is equal to or less than the fundamental frequency of the BM pattern in the 2DFFT spectrum of the composite wiring pattern.

The sum may be subtracted from the sum of the 2DFFT spectrum of the image data obtained by multiplying the transmittances of the composite pattern illustrated in FIG. 12.

Therefore, the sum can be subtracted from the BM pattern peak removed sum to calculate the sum of only the spectrums of moire/noise.

Any of the peak of the 2DFFT spectrum of the BM pattern 38 and the peak of the 2DFFT spectrum of the composite wiring pattern (wiring pattern 24*a*) may be removed first from the sum of the 2DFFT spectrum of the composite pattern.

The common logarithm of the calculated sum of only the spectrums of moire/noise can be used to obtain the extraction quantitative value (common logarithm) of moire/noise.

Then, as Process 4, the wiring pattern is evaluated on the basis of the quantitative value of moire.

As illustrated in FIG. 10, in Step S16, when the extraction quantitative value (common logarithm) of moire/noise (the quantitative value of moire) obtained in Step S14 is in a predetermined range, the composite wiring pattern, that is, a combination of the wiring patterns 24*a* and 24*b* is evaluated to be an optimized combination of the wiring patterns 24*a* and 24*b* in the conductive film 10 according to the invention, is set as an optimized combination of the wiring patterns 24*a* and 24*b*, and is evaluated to be the conductive film 10 according to the invention.

The reason why the quantitative value of moire is limited in the predetermined range is that, when the quantitative value of moire is beyond the predetermined range, moire which is generated by the interference between the BM pattern and one mesh pattern with higher regularity of two types of wiring patterns having different variations is seen despite the masking effect of noise generated by the other mesh pattern with lower regularity, the moire makes the user who sees the moire to feel discomfort or the noise generated by the mesh pattern with lower regularity is remarkable, which makes the user who sees the moire to feel discomfort. When the quantitative value of moire is in the predetermined range, the masking effect of noise makes the user feel no discomfort even when the moire is generated due to a change in the observation distance.

The predetermined range is appropriately set according to the characteristics of the conductive film and the display device, specifically, the width of the thin metal wire 14, the shape, size (for example, the pitch), and angle of the opening portions 22 (22*a* and 22*b*) in the wiring patterns 24*a* and 24*b* of two conductive parts 16 (16*a* and 16*b*), and the shape, size (for example, the pitch) and arrangement angle of the BM pattern 38. For example, when the quantitative value of moire is E, E is preferably less than −2.150 in common logarithm ($10^{-2.150}$ in antilogarithm) and is more preferably less than −2.20425 in common logarithm ($10^{-2.20425}$ in antilogarithm).

For a plurality of combinations of the wiring patterns 24*a* and 24*b*, moire evaluation indexes were calculated using a simulation sample and the actual sample and three researchers performed visual sensory evaluation for moire generated by the interface between the wiring patterns 24*a* and 24*b* and the BM pattern 38. As a result of the evaluation, when the quantitative value E of moire was less than −2.150 in common logarithm, the moire generated by the interference between the BM pattern (38) and the wiring pattern (24*a*) with high regularity was masked by noise generated by the wiring pattern (24*b*) with low regularity, was less likely to be seen, and was at a level or more at which the user hardly feels discomfort. When the quantitative value E of moire was less than −2.20425 in common logarithm, the moire was at a level at which the user does not feel any discomfort due to the masking effect of noise. This will be described in detail below.

Therefore, in the invention, the quantitative value E of moire is specified to be preferably less than −2.150 and more preferably less than −2.20425 in common logarithm.

In this way, the method for evaluating the wiring lines of the conductive film according to the invention ends. It is possible to manufacture the conductive film according to the invention which includes two types of optimized wiring patterns having different regularities, can suppress the generation of moire even when it is superimposed on the BM pattern of the display unit of the display device, and is excellent in the visibility of moire, regardless of the observation distance, even when it is used in display devices with different resolutions.

Next, a conductive film and a touch panel according to a second embodiment of the invention will be described. Here, the numerical range represented by "to" means a range which includes values before and after "to" as a lower limit and an upper limit, respectively. In the second embodiment of the invention, the same matters as those applied to the first embodiment of the invention can be applied. Inversely, the same matters as those applied to the second embodiment of the invention can be applied to the first embodiment of the invention.

FIG. 17 is an exploded perspective view illustrating a main portion of a touch panel 200 according to the invention which includes the conductive film according to the second embodiment of the invention. The touch panel 200 includes a sensor body 202 and a control circuit (for example, an IC circuit) (not illustrated).

The sensor body 202 includes a stacked conductive film (conductive film) 112 which is formed by stacking a first sheet body 110A and a second sheet body 110B in this order from the lower side and a protective layer 206 which is provided on the second sheet body 110B. That is, in the sensor body 202, the first sheet body 110A, the second sheet body 110B, and the protective layer 206 are stacked in this order from the lower side.

The sensor body 202 (the stacked conductive film 112 and the protective layer 206) is provided on a display panel 210 of a display device 208 such as a liquid crystal display. The sensor body 202 includes a sensor portion 212 which is provided at a touch position arranged in a region corresponding to a display screen 210a of the display panel 210 and a terminal wiring portion 214 (so-called frame) which is provided in a region corresponding to an outer peripheral portion of the display panel 210, as seen from the upper side.

Here, the stacked conductive film 112 will be described with reference to FIGS. 18 and 19 which are enlarged views illustrating a main portion.

The first sheet body 110A includes a first conductive pattern 118A as a first conductive portion (first electrode) 116A that is formed on one main surface of a first transparent base 114A which is an insulating layer. Similarly, the second sheet body 110B includes a second conductive pattern 118B (second conductive portion (second electrode) 116B) that is formed on one main surface of a second insulating transparent base 114B.

The thickness of the first transparent base 114A and the second transparent base 114B is preferably in the range of 20 µm to 350 µm, more preferably in the range of 30 µm to 250 µm, and most preferably in the range of 40 urn to 200 µm.

For example, a plastic film, a plastic plate, or a glass plate can be used as the first transparent base 114A and the second transparent base 114B.

The plastic film and the plastic plate can be made of, for example, a polyester-based material, such as polyethylene terephthalate (PET) or polyethylene naphthalate (PEN), a polyolefin-based material, such as polyethylene (PE), polypropylene (PP), polystyrene, or polyethylene-vinyl acetate (EVA), a vinyl-based resin, polycarbonate (PC), polyamide, polyimide, an acrylic resin, triacetyl cellulose (TAC), or cyclo-olefin polymer (COP)

The first transparent base 114A and the second transparent base 114B are preferably a plastic film or a plastic plate having a melting point of about 290° C. or lower which is made of PET (melting point: 258° C.), PEN (melting point: 269° C.), PE (melting point: 135° C.), PP (melting point: 163° C.), polystyrene (melting point: 230° C.), polyvinyl chloride (melting point: 180° C.), polyvinylidene chloride (melting point: 212° C.), or TAC (melting point: 290° C.). Among these materials, PET is particularly preferable in terms of, for example, transparency or workability. The conductive films, such as the first sheet body 110A and the second sheet body 110B used in the stacked conductive film 112, require transparency. Therefore, it is preferable that the first transparent base 114A and the second transparent base 114B have high transparency.

In this embodiment, as illustrated in FIG. 18, the first conductive pattern 118A includes a plurality of strip-shaped patterns each of which extends in a first direction (the x direction/the longitudinal direction). A plurality of first conductive patterns 118A each have a predetermined width (electrode width w1) in a second direction (a direction perpendicular to the first direction: a y direction) and are arranged in parallel in the y direction.

Each of the first conductive patterns 118A is formed by intersecting thin wires 120 (wire rods) which are made of silver, copper, molybdenum, an alloy including at least one of them, or a conductive fiber. A plurality of spaces (opening portions) surrounded by the thin wires 120, that is, cells 122A are formed by the intersection of the thin wires.

The plurality of cells 122A have different shapes and have low regularity (uniformity), as illustrated in FIG. 20. In other words, a mesh pattern of the first conductive pattern 118A formed by the thin wires 120 is a random pattern. For example, cells 122a and 122f have a trapezoidal shape and cells 122b and 122e have an octagonal shape. In addition, a cell 122d has a rectangular shape which has rounded corners and is partially occupied with the cells 122b and 122f. Here, for the random mesh pattern of the first conductive pattern 118A, the standard deviation of a 2DFFT spectrum is may be less than −5.0.

FIG. 21 illustrates another example of the cell 122A. In this case, the cell 122A which is hatched has a polygonal shape formed by a straight thin wire 120p that connects a vertex C1 and a vertex C2, a straight thin wire 120q that connects a vertex C2 and a vertex C3, a straight thin wire 120r that connects a vertex C3 and a vertex C4, and a straight thin wire 120s that connects a vertex C4 and a vertex C1. The other cells (cell 122A) also have a polygonal shape.

In the example illustrated in FIG. 20 or FIG. 21, the size (width) of the thin wire 120 in the width direction is not particularly limited and can be set to, for example, 10 µm or less. It is preferable that the width of the thin wire 120 is equal to or less than 5 µm. The granular feeling of noise and moire is improved by the random shape of the cell 122A and the small width of the thin wire 120 and visibility is improved. It is more preferable that the width is equal to or less than 3 µm. It is preferable that the width of the thin wire 120 is equal to or greater than 1 µm in order to ensure the detection sensitivity of the touch panel 200.

For the reasons stated above, it is preferable that the width of the cell forming the random pattern is in the range of 1 µm to 5 µm. Therefore, the granular feeling of noise is reduced and transmittance is improved.

It is preferable that the gap between adjacent cells 122A, that is, an average cell pitch (the distance between the centers of gravity of adjacent cells) is in the range of 100 µm to 500 µm. The average cell pitch in the random pattern can be calculated as the diameter of a minimum circle including one cell 122A.

When the average cell pitch is set in the above-mentioned range, it is possible to improve transmittance. It is more preferable that the average cell pitch is in the range of 100 µm to 300 µm. In this case, it is possible to further improve transmittance. As illustrated in FIG. 18, one end of each first conductive pattern 118A is electrically connected to a first terminal wiring pattern 142a formed by the thin wire 120 through a first connection portion 140a.

As illustrated in FIG. 18, the second conductive pattern 118B which is formed on one main surface of the second transparent base 114B (see FIG. 19) forming the second sheet body 110B includes a plurality of strip-shaped patterns each of which extends in a second direction (y direction). The plurality of second conductive patterns 118B are arranged in the first direction (x direction). That is, in the stacked conductive film 112, as illustrated in FIG. 19, the first conductive pattern 118A and the second conductive pattern 118B face each other, with the second insulating transparent base 114B interposed therebetween.

It is preferable that the width (electrode width w2) of the second conductive pattern 118B in the x direction is less than the electrode width w1 of the first conductive pattern 118A. The electrode width w1 and the electrode width w2 may be equal to each other.

Similarly to the first conductive pattern 118A, each of the second conductive patterns 118B is formed by intersecting the thin wires 120. A space (opening portion) surrounded by the thin wires 120, that is, a cell 122B is forming by the intersection of the thin wires.

In this case, as illustrated in FIG. 22, it is preferable that the cell 122B has a rhombic shape which has four sides with the same length and has two obtuse angles and two acute angles. The intersection angles c between the obtuse angles that are opposite to each other have the same angle of greater than 90° and the intersection angles β between the acute angles have the same angle of less than 90°.

It is preferable that the intersection angle β, which is an acute angle, is equal to or less than 70°. In this case, this structure is effective in reducing moire. However, when the angle β is too small, moire is likely to be generated. In order to avoid the problem, the angle β is preferably in the range of 30° to 70° and more preferably in the range of 45° to 70°.

The shape of the cell 122B is not limited to the horizontally long rhombus illustrated in FIG. 22 and may be a vertically long rhombus.

In the cell 122B, the size $W_L$ (width) of the thin wire 120 in the width direction is preferably equal to or less than 4 μm and more preferably equal to or less than 2 μm. In this case, moire which is generated by the conductive pattern formed by the thin wires 120 and silver wires are less likely to be seen and visibility is improved (that is, the thin wire 120 is less likely to be seen). In addition, it is preferable that the size $W_L$ of the thin wire 120 in the width direction is equal to or greater than 1 μm in order to ensure the detection sensitivity of the touch panel 200.

For the reasons stated above, it is preferable that the width of the cell forming the regular pattern is in the range of 1 μm to 5 μm. In this case, moire and electrodes are less likely to be seen and visibility is improved. In addition, detection sensitivity is ensured.

The gap between adjacent cells 122B, that is, the pitch between the cells (the distance between the centers of gravity of adjacent cells) is preferably equal to or less than 300 This structure is effective in preventing moire and silver wires from being seen.

The standard deviation of the 2DFFT spectrum of the regular pattern of the second conductive pattern 118B is preferably equal to or greater than −5.0.

As illustrated in FIG. 18, one end of each of the second conductive patterns 118B is electrically connected to a second terminal wiring pattern 142b formed by the thin wire 120 through a second connection portion 140b.

As illustrated in FIG. 18, in the first sheet body 110A applied to the touch panel 200, a plurality of first conductive patterns 118A are arranged in a portion corresponding to the sensor portion 212 and a plurality of first terminal wiring patterns 142a which are formed by the thin wires 120 and extend from each of the first connection portions 140a are arranged in the terminal wiring portion 214.

In the example illustrated in FIG. 17, in a peripheral portion of the terminal wiring portion 214 which corresponds to one long side of the first sheet body 110A, a plurality of first terminals 216a are arranged and formed in a central portion in the length direction of the long side. A plurality of first connection portions 140a (for example, odd-numbered first connection portions 140a) are arranged in a straight line along one short side (a short side closest to one short side of the first sheet body 110A: the y direction) of the sensor portion 212 and a plurality of first connection portions 140a (for example, even-numbered first connection portions 140a) are arranged in a straight line along the other short side (a short side closest to the other short side of the first sheet body 110A: the y direction) of the sensor portion 212.

Among a plurality of first conductive patterns 118A, for example, the odd-numbered first conductive patterns 118A are connected to the corresponding odd-numbered first connection portions 140a and the even-numbered first conductive patterns 118A are connected to the corresponding even-numbered first connection portions 140a. The first terminal wiring patterns 142a extending from the odd-numbered first connection portions 140a and the first terminal wiring patterns 142a extending from the even-numbered first connection portions 140a are led to a substantially central portion of one long side of the first sheet body 110A and are electrically connected to the corresponding first terminals 216a. Therefore, for example, the first and second first terminal wiring patterns 142a are led with substantially the same length. Similarly, the (2n−1)-th and (2n)-th first terminal wiring patterns 142a are led with substantially the same length. As such, since the first terminals 216a are formed in the central portion of one long side of the first sheet body 110A in the length direction, it is possible to suppress a local signal transmission delay, which results in an increase in the response speed.

The outward shape of the second sheet body 110B is a rectangle and the outward shape of the sensor portion 212 is also a rectangle, as viewed from the upper side. In the peripheral portion of the terminal wiring portion 214 which corresponds to one long side of the second sheet body 110B, a plurality of second terminals 216b are arranged and formed in a central portion in the longitudinal direction. In addition, a plurality of second connection portions 140b are arranged in a straight line along one long side (a long side closest to one long side of the second sheet body 110B: the x direction) of the sensor portion 212. The second terminal wiring patterns 142b extending from each second connection portion 140b are led to a substantially central portion of one long side of the second sheet body 110B and are electrically connected to the corresponding second terminals 216b.

Therefore, the second terminal wiring patterns 142b which are connected to the second connection portions 140b corresponding to both sides of one long side of the sensor portion 212 are led with substantially the same length. According to this structure, it is possible to suppress a local signal transmission delay, which contributes to increasing the response speed.

The extension form of the first terminal wiring pattern 142a may be the same as that of the second terminal wiring pattern 142b. Inversely, the extension form of the second terminal wiring pattern 142b may be the same as that of the first terminal wiring pattern 142a.

As illustrated in FIG. 19, the stacked conductive film 112 is formed by stacking the second sheet body 110B on the first sheet body 110A. At that time, an adhesive (also referred to as OCA) 130 is provided as an adhesive sheet between an upper end surface (that is, the upper surfaces of the first conductive pattern 118A and the first transparent base 114A) of the first sheet body 110A and a lower end surface of the second sheet body 110B. FIG. 23 is a plan view illustrating an example of a portion (overlap portion) in which the first conductive pattern 118A and the second conductive pattern 118B overlap each other in the stacked conductive film 112.

When the stacked conductive film 112 is used as the touch panel 200, the protective layer 206 is formed on the second sheet body 110B. The adhesive (OCA) 130 is provided as an adhesive sheet between the upper end surface of the second sheet body 110B and the lower end surface of the protective layer 206. The first terminal wiring patterns 142a which extend from a plurality of first conductive patterns 118A in the first sheet body 110A and the second terminal wiring patterns 142b which extend from a plurality of second conductive patterns 118B in the second sheet body 110B are connected to, for example, a control circuit which controls scanning.

A self-capacitance method or a mutual capacitance method can be preferably used as a touch position detection method. That is, in the self-capacitance method, a voltage signal for detecting a touch position is sequentially supplied to the first conductive patterns 118A and a voltage signal for detecting a touch position is sequentially supplied to the second conductive patterns 118B. When a fingertip approaches or comes into contact with the upper surface of the protective layer 206, the capacitance between the ground (GND) and the first and second conductive patterns 118A and 118B facing the touch position increases and the waveform of a transmission signal from the first conductive pattern 118A and the second conductive pattern 118B is different from the waveforms of transmission signals from the other conductive patterns. Therefore, the control circuit calculates the touch position on the basis of the transmission signal supplied from the first conductive pattern 118A and the second conductive pattern 118B.

In the case of the mutual capacitance method, for example, a voltage signal for detecting a touch position is sequentially supplied to the first conductive patterns 118A and sensing (the detection of a transmission signal) is sequentially performed for the second conductive patterns 118B. When a fingertip approaches or comes into contact with the upper surface of the protective layer 206, the floating capacitance of the finger is added to the parasitic capacitance between the first conductive pattern 118A and the second conductive pattern 118B facing the touch position and the waveform of a transmission signal from the second conductive pattern 118B is different from the waveforms of transmission signals from the other second conductive patterns 118B. Therefore, the control circuit calculates the touch position on the basis of the order of the first conductive patterns 118A supplied with the voltage signal and a transmission signal supplied from the second conductive pattern 118B.

In the case in which the self-capacitance method or the mutual capacitance method is used as the touch position detection method, even when the tips of two fingers approach or come into contact with the upper surface of the protective layer 206 at the same time, it is possible to detect each touch position. The prior art related to a detection circuit of a projection capacitive type is disclosed in, for example, U.S. Pat. No. 4,582,955A, U.S. Pat. No. 4,686,332A, U.S. Pat. No. 4,733,222A, U.S. Pat. No. 5,374,787A, U.S. Pat. No. 5,543,588A, U.S. Pat. No. 7,030,860B, and US2004/0155871A.

The first conductive pattern 118A and the second conductive pattern 118B can be preferably formed by a microcontact printing and patterning method or a silver salt method in order to obtain a pattern with a small width. It is more preferable to use a silver salt method without using a stamp which is worn away, in order to repeat a large number of random patterns.

The microcontact printing and patterning method obtains a pattern with a small width using a microcontact printing method. Here, the microcontact printing method uses an elastic stamp made of polydimethylsiloxane and brings a thiol solution as ink into contact with a metal base to form a pattern of a monomolecular film (see Whitesides, Angew. Chem. Int. Ed., 1998, Vol. 37, page 550).

A representative process of the microcontact printing patterning method is, for example, as follows. That is, first, a base is coated with metal (for example, a PET base is coated with silver by sputtering).

A monomolecular film mask is stamped on the base coated with metal by the microcontact printing method. Then, the metal coated on the base is removed by etching except for the pattern below the mask.

For example, the above-mentioned process has been described in detail in paragraph "0104" of JP2012-519329A.

The silver salt method exposes and develops a photosensitive material having a layer containing photosensitive silver salt to obtain a mesh pattern of the thin wires 120. For example, this process has been described in detail in paragraphs "0163" to "0241" of JP2009-4348A.

Table 1 shows the characteristics of the obtained touch panel 200 together with the characteristics of a touch panel A in which both the first conductive pattern and the second conductive pattern are regular patterns (rhombic shape) and a touch panel B in which both the first conductive pattern and the second conductive pattern are random patterns. As can be seen from Table 1, in the touch panel 200, moire is reduced and visibility is high, as compared to the touch panel A. In addition, in the touch panel 200, moire and the granular feeling of moire and noise are reduced and transmittance is high, as compared to the touch panel B.

That is, when the first conductive pattern 118A is a random pattern and the second conductive pattern 118B is a regular pattern, it is possible to obtain the touch panel 200 having excellent characteristics.

In the invention, when the conductive portions of the conductive film having the first and second conductive portions (electrodes) provided on both main surfaces are designed, particularly, the wiring pattern provided in the first and second conductive portions can be a mixed mesh pattern of mesh patterns having different variations in regularity such that the wiring pattern is a mixed pattern of a random pattern and a regular pattern. Therefore, it is possible to easily design a wiring pattern.

TABLE 1

|  | Both patterns are regular patterns | Both patterns are random patterns | Regular pattern and random pattern |
|---|---|---|---|
| Moire | Δ | ◯ | ◯ |
| Granular feeling of noise | ◯ | Δ | ◯ |
| Transmittance | ◯ | Δ | ◯ |
| Visibility | Δ | ◯ | ◯ |

The invention is not particularly limited to the above-described embodiments and various changes and modifications can be made without departing from the scope and spirit of the invention.

For example, in this embodiment, the first conductive pattern 118A provided on the lower side is a random pattern and the second conductive pattern 118B provided on the upper side is a regular pattern. However, inversely, the first conductive pattern 118A provided on the lower side may be a regular pattern and the second conductive pattern 118B provided on the upper side may be a random pattern.

The stacked conductive film 112 is not limited to the structure in which the first conductive pattern 118A is formed on one main surface of the first transparent base 114A, the second conductive pattern 118B is formed on one main surface of the second transparent base 114B, and the two transparent bases are stacked (see FIGS. 18 and 19). That is, as illustrated in FIG. 24, the first conductive pattern 118A may be formed on one main surface of the first transparent base 114A and the second conductive pattern 118B may be formed on the other main surface of the first transparent base 114A. In this case, the second transparent base 114B is not provided, the first transparent base 114A is stacked on the first conductive pattern 118A, and the second conductive pattern 118B is stacked on the first transparent base 114A.

Furthermore, the first conductive pattern 118A and the second conductive pattern 118E may be formed on the same main surface of the first transparent base 114A. In this case, the first conductive pattern 118A and the second conductive pattern 118B are insulated from each other through an insulating portion such as a space or a dummy pattern.

The cell 122B (or the cell 122A) is not limited to the rhombic shape and may have, for example, a parallelogram shape (except for a rhombus), a polygonal shape, or a shape having an arc.

In this case, the purpose of the stacked conductive film 112 is not particularly limited to the sensor body 202 of the touch panel 200 and the stacked conductive film 112 can be used for various electrodes of, for example, an inorganic EL element, an organic EL element, or a solar cell. In addition, the stacked conductive film 112 can be applied to a transparent heating body (for example, an in-vehicle defroster) which is supplied with a current and generates heat and an electromagnetic wave shielding member which shields electromagnetic waves, in addition to the electrodes.

EXAMPLES

Hereinafter, the invention will be described in detail with reference to examples.

For example, materials, the amounts used, proportions, the content of processes, and the procedure of the processes described in the following examples can be appropriately changed without departing from the scope and spirit of the invention. That is, the scope of the invention should not be construed as being limited by the following examples.

First Example

For the BM pattern 38 illustrated in FIG. 11(A) and the conductive film 10 according to the first embodiment having a composite wiring pattern, which was a combination of the wiring pattern 24b as an irregular pattern illustrated in FIG. 16(A) and the wiring pattern 24a as a regular pattern illustrated in FIG. 16(C), the combination of the wiring patterns 24a and 24b was changed to various combinations with different pattern regularities and the combination of the wiring patterns 24a and 24b and the BM pattern 38 were superimposed on each other in simulation samples and the actual samples. Then, the quantitative value of moire was calculated and three researchers performed visual sensory evaluation for moire which was generated due to the interference between the two superimposed patterns.

The sensory evaluation results were represented by three levels ○(1), Δ(2), and x(3). When all of three researches evaluated that moire did not cause discomfort, ○(1) indicating that the moire "did not cause discomfort" was given. When all of three researches evaluated that the moire caused little discomfort, or when at least one researcher evaluated that the moire did not cause discomfort and the other researchers evaluated that moire caused little discomfort, Δ(2) indicating that the moire "caused little discomfort" was given. When any one of them evaluated that the moire was seen and caused discomfort, x(3) indicating that the moire "caused discomfort" was given.

The BM pattern 38 used in this example was the rectangular pattern illustrated in FIG. 11(A) and had a resolution of 12700 dpi and an image size of 9944 (pixels)×9944 (pixels). The resolution of the sub-pixels 32g in G filters was 112 dpi and the sub-pixels 32g had a rectangular shape and had a size of 28 (pixels)×77 (pixels).

The regular pattern used as the wiring pattern 24a was shown as regular parameters 25, 27, 30, and 45 in Table 2. The regular parameter 25 was a regular rhombic pattern having a pitch (p) of 252 μm and an opposite angle (θ) of 25° [deg], as illustrated in FIG. 16(C).

As illustrated in FIG. 15, the standard deviation of the spectrum of each of the regular patterns which were shown as the regular parameters 25 (0.0284), 27 (0.018622), 30 (0.014924), and 45 (0.008493) in Table 2 was equal to or greater than −5 (−5.000).

The irregular pattern used as the wiring pattern 24b was shown as irregular parameters 40 (0.017093), 42 (0.015673), 44 (0.01072), and 46 (0.006503) in Table 2. The irregular parameters 40 and 44 were the random patterns illustrated in FIGS. 16(A) and 16(B), respectively.

As illustrated in FIG. 15, the standard deviation of the spectrum of each of the irregular patterns which were shown as the irregular parameters 40, 42, 44, and 46 in Table 2 was less than −5 (−5.000).

In addition, the width of the thin metal wire 14 in the wiring patterns 24a and 24b was 4 μm.

In Table 2, when a total of 16 combinations of the irregular patterns as the irregular parameters 40, 42, 44, and 46 and the regular patterns as the regular parameters 25, 27, 30, and 45 were superimposed on the BM pattern 38, the quantitative value of moire was calculated and visual sensory evaluation was performed for the moire.

The results are shown in Table 2.

TABLE 2

| Irregular parameter | 40 | 40 | 40 | 40 | 42 | 42 | 42 | 42 |
|---|---|---|---|---|---|---|---|---|
| (standard deviation) | −5.026 | −5.026 | −5.026 | −5.026 | −5.105 | −5.105 | −5.105 | −5.105 |
| Regular parameter | 25 | 27 | 30 | 45 | 25 | 27 | 30 | 45 |
| (standard deviation) | −4.360 | −4.431 | −4.493 | −4.627 | −4.360 | −4.431 | −4.493 | −4.627 |
| Sum of moire/noise | 0.1563 | 0.15763 | 0.15931 | 0.16383 | 0.15802 | 0.16073 | 0.16264 | 0.16641 |
| Sum of mesh | 0.1481 | 0.1507 | 0.1523 | 0.1545 | 0.1503 | 0.1529 | 0.1545 | 0.1567 |

TABLE 2-continued

| | | | | | | | | |
|---|---|---|---|---|---|---|---|---|
| Extraction quantitative value of moire/noise (common logarithm) | −2.087 | −2.161 | −2.155 | −2.029 | −2.113 | −2.106 | −2.092 | −2.011 |
| Sensory evaluation result | x | Δ | Δ | x | x | x | x | x |
| Irregular parameter | 44 | 44 | 44 | 44 | 46 | 46 | 46 | 46 |
| (standard deviation) | −5.286 | −5.286 | −5.286 | −5.286 | −5.439 | −5.439 | −5.439 | −5.439 |
| Regular parameter | 25 | 27 | 30 | 45 | 25 | 27 | 30 | 45 |
| (standard deviation) | −4.360 | −4.431 | −4.493 | −4.627 | −4.360 | −4.431 | −4.493 | −4.627 |
| Sum of moire/noise | 0.16149 | 0.1633 | 0.1648 | 0.16876 | 0.16333 | 0.16489 | 0.16674 | 0.17027 |
| Sum of mesh | 0.1538 | 0.1565 | 0.1581 | 0.1603 | 0.1559 | 0.1587 | 0.1605 | 0.1627 |
| Extraction quantitative value of moire and noise (common logarithm) | −2.114 | −2.169 | −2.173 | −2.074 | −2.131 | −2.209 | −2.204 | −2.120 |
| Sensory evaluation result | x | Δ | Δ | x | x | ○ | ○ | x |

As can be seen from Table 2, in the BM pattern and the combination of two types of wiring patterns with different regularities, when the quantitative value E of moire is less than −2.150 in common logarithm, moire generated by the interference between the wiring pattern (24a) and the BM pattern (38) superimposed on each other is seen, but is equal to or higher than the level (Δ(2)) at which the moire causes little discomfort due to the masking effect of noise. When the quantitative value E of moire is less than −2.20425 in common logarithm, the moire is at the level (○(1)) at which the moire does not cause discomfort due to the masking effect of noise.

As described above, according to the conductive film of the invention including two types of wiring patterns with different regularities which have the quantitative value of moire satisfying the above-mentioned range, even when the resolution of the display is different, it is possible to suppress the generation of moire, regardless of the observation distance, to improve the visibility of moire which is theoretically inevitable, using the masking effect of noise, and to significantly improve visibility.

The effect of the invention is clear from the above description.

In the invention, as in the above-mentioned example, combinations of wiring patterns with various pattern shapes are prepared in advance and a conductive film having an optimized combination of the wiring patterns can be determined by the evaluation method according to the invention. When the quantitative value of moire in one combination of the wiring patterns is beyond a predetermined range, a process which updates the transmittance image data of at least one wiring pattern in the combination of the wiring patterns with the transmittance image data of a new wiring pattern and calculates the quantitative value of moire using the evaluation method according to the invention can be repeatedly performed to determine a conductive film having an optimize combination of wiring patterns.

The new updated wiring pattern may be prepared in advance or may be newly created. When the wiring pattern is newly created, it may be a regular wiring pattern or an irregular wiring pattern. In addition, at least one of a rotation angle, a pitch, and a pattern width of the transmittance image data may be changed or the shape or size of an opening portion in the wiring pattern may be changed. When the new wiring pattern is an irregular wiring pattern, the repetitive pattern of the opening portions (cells) may be randomized, in addition to the change in the shape or size of the opening portion.

Second Example

Silver Halide Photosensitive Material

An emulsion which included 10.0 g of gelatin with respect to 150 g of Ag in an aqueous medium and contained iodobromochloride silver particles (I=0.2 mol %, Br=40 mol %) having an average sphere-equivalent diameter of 0.1 vim was produced.

$K_3Rh_2Br_9$ and $K_2IrCl_6$ were added to the emulsion such that concentration was $10^{-7}$ (mol/mol Ag) to dope silver bromide particles with Rh ions and Ir ions. In addition, $Na_2PdCl_4$ was added to the emulsion and old-sulfur sensitization was performed for the emulsion using chloroauric acid and sodium thiosulfate. Then, a gelatin hardening agent and the emulsion were applied onto a base (here, on polyethylene terephthalate (PET)) such that the amount of silver applied was 10 g/m². At that time, the volume ratio of Ag to gelatin was 2/1.

The emulsion was applied with a width of 25 cm and a length of 20 m onto a PET support with a width of 30 and each of both ends of the support was cut by 3 cm such that 24 cm of the central portion of the coated support was left. In this way, a roll-shaped silver halide photosensitive material was obtained.

(Exposure)

For an exposure pattern, photomasks for the following electrode patterns 1 to 4 were manufactured. The exposure was performed using parallel light from a high-pressure mercury lamp as a light source through the photomasks.

(Development Process)

| Formulation of 1 L of Developer | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH adjusted to 10.3 | |

| Formulation of 1 L of Fixer | |
|---|---|
| Ammonium thiosulfate liquid (75%) | 300 ml |
| Ammonium sulfite monohydrate | 25 g |
| 1,3-diaminopropane tetraacetic acid | 8 g |
| Acetic acid | 5 g |
| Aqueous ammonia (27%) | 1 g |
| pH adjusted to 6.2 | |

The following processes were performed for the photosensitive material exposed with the above-mentioned processing agent under the following conditions, using an automatic developing machine FG-710PTS manufactured by Fuji Photo Film Co., Ltd.: development: 35° C. and 30 seconds; fixation: 34° C. and 23 seconds; and water washing: a water flow of 5 L/minute and 20 seconds).

Electrode patterns 1 to 4 are as follows.

Electrode pattern 1: each cell has a rhombic shape in which the length of one side is 0.4 mm, an angle is 60°, and a line width is 5.0 μm.

Electrode pattern 2: each cell has a rhombic shape in which the length of one side is 0.4 mm, an angle is 60°, and a line width is 2.0 μm.

In the case of electrode patterns 1 and 2, the cells (rhombic shape) are arranged so as not to overlap each other.

Electrode pattern 3: each cell has a random polygonal shape and, when the diameter of a minimum circle including each polygon is R, R is in the range of 200 μm to 500 μm; and a line width is 5.0 μm.

Electrode pattern 4: each cell has a random polygonal shape and, when the diameter of a minimum circle including each polygon is R, R is in the range of 200 μm to 500 μm; and a line width is 2.0 μm.

The four types of electrode patterns were set in an exposure apparatus and exposure was performed such that a line width was equal to that of a mask. In this way, a conductive sheet having an electrode with any one of electrode patterns 1 to 4 was manufactured.

Two conductive sheets were selected from these conductive sheets and a stacked conductive sheet 150 for evaluation illustrated in FIG. 25 was manufactured. Here, in FIG. 25, reference numerals 152, 154, 156, 158, and 160 indicate a lower electrode, an OCA, an upper electrode, an OCA, and glass, respectively.

A stacked conductive sheet 150 for evaluation, which is a combination of electrode pattern 2 (rhombic shape) as the lower electrode 152 and electrode pattern 4 (random shape) as the upper electrode 156, is Example 1. In addition, a stacked conductive sheet 150 for evaluation, which is a combination of electrode pattern 4 (random shape) as the lower electrode 152 and electrode pattern 2 (rhombic shape) as the upper electrode 156, is Example 2. A stacked conductive sheet 150 for evaluation, which is a combination of electrode pattern 1 (rhombic shape) as the lower electrode 152 and electrode pattern 4 (random shape) as the upper electrode 156, is Example 3. A stacked conductive sheet 150 for evaluation, which is a combination of electrode pattern 2 (rhombic shape) as the lower electrode 152 and electrode pattern 3 (random shape) as the upper electrode 156, is Example 4.

For comparison, a conductive film in which both the lower electrode 152 and the upper electrode 156 had a rhombic electrode pattern (Comparative Example 1) and a conductive film in which both the lower electrode 152 and the upper electrode 156 had a random electrode pattern (Comparative Example 2) were manufactured. That is, in Comparative Example 1, both the lower electrode 152 and the upper electrode 156 have electrode pattern 2. In Comparative Example 2, both the lower electrode 152 and the upper electrode 156 have electrode pattern 4.

(Evaluation)

Examples 1 to 4 and Comparative Examples 1 and 2 were placed on an LCD panel "B156XW04" manufactured by AU Optronics Corporation, with a white light of the LCD panel being turned on, and were visibly observed at a position that was 30 cm to 50 cm away from the LCD panel.

At that time, "moire" in which a specific pattern, such as a ripple, was observed, "noise" which felt as flickering or granularity, and the visibility of the electrode pattern were evaluated. In the evaluation results, ○ indicates the level at which the observer does not feel discomfort, Δ indicates the level at which the observer feels a little discomfort in an allowable range, and x indicates the level at which discomfort is beyond the allowable range.

The transmittances of Examples 1 to 4 and Comparative Examples 1 and 2 were measured using a transmittance measurement device manufactured by Murakami Color Research Laboratory Co., Ltd.

In addition, an electrode pattern design and operation was performed for Examples 1 to 4 and Comparative Examples 1 and 2 and was evaluated. In the evaluation results, ○ indicates a case in which the working time is within 8 hours, Δ indicates a case in which a relatively long working time of 8 hours to 20 hours is required and is within an allowable range, and x indicates a case in which an excessively long working time of 20 hours or more is required.

The evaluation results are shown in Table 3. As can be seen from Table 3, when a random pattern electrode is combined with a rhombic pattern electrode, a conductive sheet in which moire and noise are reduced and the electrode pattern is less likely to be seen is effectively obtained.

TABLE 3

| | Lower electrode | | | Upper electrode | | | Evaluation | | | | |
|---|---|---|---|---|---|---|---|---|---|---|---|
| No. | Pattern | (Angle) | Line width [μm] | Pattern | (Angle) | Line width [μm] | Moire | Noise/moire | Visibility | Transmittance | Working time |
| Example 1 | Random | | 2.0 | Rhombus | 60° | 2.0 | ○ | ○ | ○ | 89% | Δ |
| Example 2 | Rhombus | 60° | 2.0 | Random | | 5.0 | ○ | ○ | ○ | 89% | Δ |
| Example 3 | Random | | 2.0 | Rhombus | 60° | 5.0 | Δ | ○ | ○ | 87% | Δ |
| Example 4 | Random | | 5.0 | Rhombus | 60° | 2.0 | ○ | Δ | ○ | 87% | Δ |
| Comparative example 1 | Rhombus | 60° | 2.0 | Rhombus | 60° | 2.0 | x | ○ | ○ | 89% | ○ |
| Comparative example 2 | Random | | 5.0 | Random | | 5.0 | ○ | x | Δ | 89% | x |

The conductive film, the display device including the same, and the conductive film evaluation method according to the invention have been described above with reference to various embodiments and examples. However, the invention is not limited to the above-described embodiments and examples and various improvements or design changes can be made without departing from the scope and spirit of the invention.

EXPLANATION OF REFERENCES

10: conductive film
12: transparent base
14: thin metal wire (thin metal wire)
16, 16a, 16b: conductive portion
18, 18a, 18b: adhesive layer
20, 20a, 20b: protective layer
21, 21a, 21b: mesh wire
22, 22a, 22b: opening portion
24, 24a, 24b: wiring pattern
28, 28a, 28b: conductive layer
30: display unit
32: pixel
32r, 32g, 32b: sub-pixel
34: black matrix (BM)
38: BM pattern
40: display device
44: touch panel
110A: first sheet body
110B: second sheet body
112: stacked conductive film (conductive film)
114A: first transparent base
114B: second transparent base
118A: first conductive pattern
118B: second conductive pattern
120: thin wire
122A, 122B: cell
130, 154, 158: adhesive (OCA)
150: stacked conductive sheet for evaluation
152: lower electrode
156: upper electrode
200: touch panel
202: sensor body
206: protective layer
208: display device
210: display panel
214: terminal wiring portion

What is claimed is:

1. A conductive film that is provided on a display unit of a display device, comprising:
a transparent base; and
first and second conductive portions that are formed on both surfaces of the transparent base,
wherein the first and second conductive portions include first and second wiring patterns that are formed in a mesh shape in which a plurality of opening portions are formed by a plurality of thin metal wires, respectively,
the first and second wiring patterns have at least first and second patterns that have different variations in spectrums in a two-dimensional Fourier space of transmittance image data thereof, respectively,
the first and second wiring patterns are superimposed as a composite wiring pattern on a pixel array pattern of the display unit,
a plurality of spectrums in a two-dimensional Fourier space of transmittance image data of the pixel array pattern and a plurality of spectrums in a two-dimensional Fourier space of transmittance image data of the composite wiring pattern are excluded from a plurality of spectrums in a two-dimensional Fourier space of transmittance image data of a composite pattern of the pixel array pattern and the composite wiring pattern to extract a plurality of spectrums of only noise and moire generated by interference between the pixel array pattern and the first and second wiring patterns of the composite wiring pattern,
the sum of all of the extracted plurality of spectrums is calculated, and
an extraction quantitative value of the moire and the noise calculated from the sum is in a predetermined range,
wherein the sum of the spectrums of the moire and the noise is calculated by adding only the spectrums having a frequency that is lower than a spatial frequency of the pixel array pattern, and
wherein, when the common logarithm of the quantitative value is E, the predetermined range is E<−2.150.

2. The conductive film according to claim 1,
wherein, when the common logarithm of the quantitative value is E, the predetermined range is E<−2.20425.

3. The conductive film according to claim 1,
wherein the standard deviation of spectrums in a two-dimensional Fourier space of transmittance image data of the first pattern is equal to or greater than −5.0, and
the standard deviation of spectrums in a two-dimensional Fourier space of transmittance image data of the second pattern is less than −5.0.

4. The conductive film according to claim 1,
wherein the first pattern is a regular pattern, and
the second pattern is an irregular pattern.

5. The conductive film according to claim 4,
wherein the opening portion is formed by crossing thin metal wires,
the regular pattern is a fixed pattern which is formed in a mesh shape such that a plurality of opening portions with the same shape are continuous, and
the irregular pattern is a random pattern which is formed in a mesh shape so as to include a plurality of opening portions with different shapes in a plan view.

6. The conductive film according to claim 1,
wherein the first conductive portion having the first wiring pattern is formed on an upper surface of the transparent base,
the second conductive portion having the second wiring pattern is formed on a lower surface of the transparent base,
the first wiring pattern is the first pattern,
the second wiring pattern is the second pattern, and
a width of the second wiring pattern is greater than a width of the first wiring pattern.

7. The conductive film according to claim 1,
wherein a frequency of the moire and the noise is given as a difference between a peak frequency of the composite wiring pattern and a peak frequency of the pixel array pattern, and
the intensity of the moire and the noise is given as the product of the peak intensity of the composite wiring pattern and the peak intensity of the pixel array pattern.

8. The conductive film according to claim 1,
wherein the transmittance image data and the intensity of the spectrum are normalized with the area of a transmittance image of the composite pattern.

9. The conductive film according to claim 1,
wherein the pixel array pattern is a black matrix pattern.

10. The conductive film according to claim 1,
wherein the thin metal wire forming the second pattern has a width of 1 μm to 5 μm.

11. The conductive film according to claim 1,
wherein an average pitch between the opening portions forming the second pattern is in a range of 100 μm to 500 μm.

12. The conductive film according to claim 1,
wherein the thin metal wire forming the first pattern has a width of 1 μm to 5 μm.

13. The conductive film according to claim 1,
wherein the opening portion forming the first pattern has a rhombic shape.

14. The conductive film according to claim 1,
wherein the thin metal wire forming the first pattern and the thin metal wire forming the second pattern are made of silver.

15. A touch panel comprising:
the conductive film according to claim 1.

16. A display device comprising:
a display unit; and
the conductive film according to claim 1 that is provided on the display unit.

17. A method for evaluating a conductive film which is provided on a display unit of a display device and includes a transparent base and first and second wiring patterns that are formed on both surfaces of the transparent base in a mesh shape in which a plurality of opening portions are formed by a plurality of thin metal wires and have at least first and second patterns having different variations in spectrums in a two-dimensional Fourier space of transmittance image data thereof, respectively,
the method comprising:
acquiring the transmittance image data of each of the first and second wiring patterns and transmittance image data of a pixel array pattern of the display unit on which the first and second wiring patterns are superimposed as a composite wiring pattern;
calculating transmittance image data of a composite pattern of the pixel array pattern and the composite wiring pattern from the acquired transmittance image data of the pixel array pattern and the first and second wiring patterns;
performing two-dimensional Fourier transform for the acquired transmittance image data of each of the composite pattern, the pixel array pattern, and the composite wiring pattern to calculate a plurality of spectrums in a two-dimensional Fourier space of the transmittance image data of the composite pattern,
a plurality of spectrums in a two-dimensional Fourier space of the transmittance image data of the pixel array pattern, and
a plurality of spectrums in a two-dimensional Fourier space of the transmittance image data of the composite wiring pattern;
excluding the plurality of spectrums of the pixel array pattern and the plurality of spectrums of the composite wiring pattern from the plurality of spectrums of the composite pattern and calculating the sum of a plurality of spectrums of only moire and noise generated by interference between the pixel array pattern and the first and second wiring patterns of the composite wiring pattern;
calculating an extraction quantitative value of the moire and the noise from the obtained sum;
evaluating the conductive film in which the calculated extraction quantitative value of the moire and the noise is in a predetermined range,
wherein the sum of the spectrums of the moire and the noise is calculated by adding only the spectrums having a frequency that is lower than a spatial frequency of the pixel array pattern, and
wherein, when the common logarithm of the quantitative value E, the predetermined range is $E < -2.150$.

18. A conductive film that is provided on a display unit of a display device, comprising:
a transparent base; and
first and second conductive portions that are formed on both surfaces of the transparent base,
wherein the first and second conductive portions include first and second wiring patterns that are formed in a mesh shape in which a plurality of opening portions are formed by a plurality of thin metal wires, respectively,
the first and second wiring patterns have at least first and second patterns that have different variations in spectrums in a two-dimensional Fourier space of transmittance image data thereof, respectively,
the first and second wiring patterns are superimposed as a composite wiring pattern on a pixel array pattern of the display unit,
the standard deviation of spectrums in a two-dimensional Fourier space of transmittance image data of the first pattern is equal to or greater than $-5.0$, and
the standard deviation of spectrums in a two-dimensional Fourier space of transmittance image data of the second pattern is less than $-5.0$.

* * * * *